United States Patent

Sato et al.

[11] Patent Number: 5,981,140
[45] Date of Patent: Nov. 9, 1999

[54] POSITIVE PHOTOSENSITIVE COMPOSITION

[75] Inventors: Kenichiro Sato; Kunihiko Kodama; Kazuya Uenishi; Toshiaki Aoai, all of Shizuoka, Japan

[73] Assignee: Fuji Photo Film Co., Ltd., Kanagawa, Japan

[21] Appl. No.: 08/932,168

[22] Filed: Sep. 17, 1997

[30] Foreign Application Priority Data

Sep. 20, 1996 [JP] Japan ................... 8-250518

[51] Int. Cl.⁶ .......................................... G03F 7/039
[52] U.S. Cl. ................. 430/270.1; 430/914; 430/920; 430/921; 522/25
[58] Field of Search .............. 430/270.1, 285.1, 430/908, 914, 920, 921

[56] References Cited

U.S. PATENT DOCUMENTS

| | | | |
|---|---|---|---|
| 5,550,004 | 8/1996 | Honda | 430/270.1 |
| 5,556,734 | 9/1996 | Yamachika et al. | 430/270.1 |

*Primary Examiner*—Cynthia Hamilton
*Assistant Examiner*—Rosemary Ashton
*Attorney, Agent, or Firm*—Sughrue, Mion, Zinn, Macpeak & Seas, PLLC

[57] ABSTRACT

A positive photosensitive composition comprising:

a compound represented by formula (I) or (I') and a compound represented by formula (II) as compounds which generate a sulfonic acid upon irradiation with actinic rays or radiation:

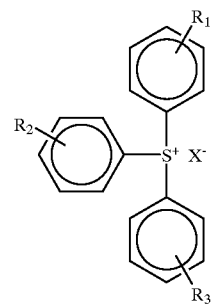

(I)

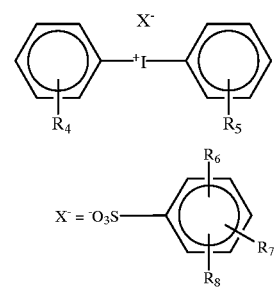

(I')

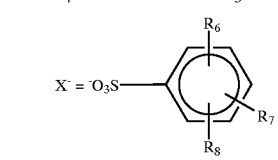

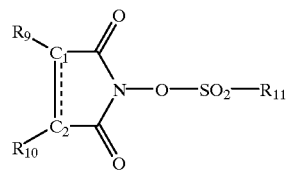

(II)

The substituents in these formulae are as defined in the specification. The positive photosensitive composition has high sensitivity and high resolving power, undergoes neither a decrease in resist pattern line width nor the formation of a T-top resist pattern surface with the lapse of time from exposure to heat treatment, and exhibits less profile deterioration such as residual standing wave and collapse.

7 Claims, No Drawings

POSITIVE PHOTOSENSITIVE COMPOSITION

FIELD OF THE INVENTION

The present invention relates to positive photosensitive compositions for use in the production of lithographic printing plates and semiconductors, e.g., integrated circuits, and the production of circuit boards for liquid crystals, thermal heads, etc., and in other photofabrication processes.

BACKGROUND OF THE INVENTION

Positive photoresist compositions in use generally comprise an alkali-soluble resin and a naphthoquinonediazide compound as a photosensitive substance. For example, photoresist compositions comprising "a combination of a phenolic novolak resin and a naphthoquinonediazide substitution compound" are described in, e.g., U.S. Pat. Nos. 3,666,473, 4,115,128, and 4,173,470. Further, an example of the most typical composition comprising "a combination of a cresol-formaldehyde novolak resin and a trihydroxybenzophenone-1,2-naphthoquinonediazidesulfonic acid ester" is described in L. F. Thompson, "Introduction to Microlithography" (ACS Press, No. 2, 19, pp. 112–121).

Many positive photoresists comprising a novolak resin and a photosensitive naphthoquinonediazide compound have been developed and put to practical use so far from the above-described standpoint. These photoresists have produced satisfactory results in the formation of resist patterns having line widths ranging about from 0.8 to 2 $\mu$m.

However, the degree of integration in integrated circuits is increasing more and more, and it has become necessary to form an ultrafine pattern having a line width of 0.5 $\mu$m or smaller in the production of semiconductor substrates for VLSIs and the like. For attaining the necessary resolving power, the wavelengths of the light sources used for photolithography are decreasing more and more and, as a result, use of far ultraviolet rays and excimer laser beams (XeCl, KrF, ArF, etc.) has come to be investigated.

The prior art resists comprising a novolak and a naphthoquinonediazide compound are unsuitable for use in pattern formation by lithography using far ultraviolet rays or excimer laser beams, because the novolak and the naphthoquinonediazide exhibit intense absorption in the far ultraviolet region to render the light less apt to reach the resist bottom. Thus, the resist has low sensitivity to give only a tapered pattern.

One means for eliminating the above problem is the chemically amplified resist composition described in, e.g., U.S. Pat. No. 4,491,628 and European Patent 249,139. A chemically amplified positive resist composition is a pattern-forming material in which an acid generates in exposed areas upon irradiation with a radiation such as far ultraviolet rays and this acid catalyzes a reaction that makes the areas irradiated with the actinic rays and the unirradiated areas which are different in solubility in a developing solution to thereby form a pattern on a substrate.

Examples thereof include combinations of a compound which generates an acid upon photodecomposition with an acetal or O,N-acetal compound (see JP-A-48-89003; the term "JP-A" as used herein means an "unexamined published Japanese patent application"), with an orthoester or amidoacetal compound (see JP-A-51-120714), with a polymer having acetal or ketal groups in the backbone (see JP-A-53-133429), with an enol ether compound (see JP-A-55-12995), with an N-acyliminocarbonic acid compound (see JP-A-55-126236), with a polymer having orthoester groups in the backbone (see JP-A-56-17345), with a tertiary alkyl ester compound (see JP-A-60-3625), with a silyl ester compound (see JP-A-60-10247), and with a silyl ether compound (see JP-A-60-37549 and JP-A-60-121446). These combinations exhibit high photosensitivity since they have a quantum efficiency exceeding 1 in principle.

Another means for eliminating the problem described hereinabove is a system which is stable over long at room temperature but decomposes upon heating in the presence of an acid to become alkali-soluble. Examples thereof include systems comprising a combination of a compound which generates an acid upon exposure to light with an ester having a tertiary or secondary carbon (e.g., t-butyl or 2-cyclohexenyl) or with a carbonic ester compound, as described in, e.g., JP-A-59-45439, JP-A-60-3625, JP-A-62-229242, JP-A-63-27829, JP-A-63-36240, JP-A-63-250642; *Polym. Eng. Sce.*, Vol. 23, p. 1012 (1983); *ACS. Sym.*, Vol. 242, p. 11 (1984); *Semiconductor World*, p. 91 (November 1987); *Macromolecules*, Vol. 21, p. 1475 (1988); and *SPIE*, Vol. 920, p. 42 (1988). Since these systems also have high sensitivity and exhibit reduced absorption in the deep UV region as compared with the naphthoquinonediazide/novolak resin systems, they can be effective systems for coping with the wavelength reduction in light sources.

The chemically amplified positive resists described above are roughly divided into two groups: three-component systems comprising an alkali-soluble resin, a compound which generates an acid upon exposure to a radiation (photo-acid generator), and a dissolution inhibitive compound for the alkali-soluble resin which has acid-decomposable groups; and two-component systems comprising a resin which decomposes upon reaction with an acid to become alkali-soluble and a photo-acid generator.

In these two-component or three-component, chemically amplified positive resists, the photo-acid generator is caused to generate an acid by exposure to light and the resists are then heat-treated and developed in the presence of the acid to obtain a resist pattern.

Known photo-acid generators for use in the above-described chemically amplified positive resists include N-imidosulfonates, N-oximesulfonates, o-nitrobenzylsulfonates, and pyrogallol trismethanesulfonate. Typical compounds which have been used as photo-acid generators having a high photodecomposition efficiency and excellent image-forming properties are the sulfonium and iodonium salts of perfluorinated Lewis acids, e.g., $PF_6^-$, $AsF_6^-$, and $SbF_6^-$, described in, e.g., JP-A-59-45439 and *Polym. Eng. Sci.*, 23, 1012 (1983).

However, these prior art photo-acid generators, when used in resist materials for semiconductors, have a problem that the counter anions of the photo-acid generators cause pollution by phosphorus, arsenic, antimony, etc.

Used as a sulfonium or iodonium compound free from the pollution is the salt described in, e.g., JP-A-63-27829, JP-A-2-25850, JP-A-2-150848, JP-A-5-134414, and JP-A-5-232705, in which the counter anion is a trifluoromethanesulfonate anion.

It should, however, be noted that this prior art composition has a problem that since trifluoromethanesulfonic acid, which generates upon exposure to light, diffuses relatively rapidly in the resist film, the line width of the resist pattern which is being produced becomes narrower with the lapse of time from exposure to light to heat treatment or the resist pattern comes to have a T-top surface.

Although use of a toluenesulfonate anion as another counter anion for sulfonium or iodonium is described in, e.g., JP-A-2-25850, JP-A-2-150848, JP-A-6-43653, and JP-A-6-123972, this salt has a problem that since it has insufficient solubility in ordinary resist solvents, the addition amount thereof is limited, resulting in insufficient sensitivity.

Furthermore, JP-A-6-199770 describes the use of an arylbenzenesulfonate anion having a linear hydrocarbon substituent as a still another counter anion for sulfonium and iodonium salts. The sulfonium and iodonium salts containing the arylbenzenesulfonate anion have improved solubility in ordinary resist solvents. However, this prior art technique also has the problem that the resist pattern which is being formed comes to have a reduced line width or a T-top surface with the lapse of time from exposure to heat treatment.

It has become apparent that the above change in resist pattern with the lapse of time from exposure to heat treatment varies considerably depending on the kinds of the groups (acid-decomposable groups) contributing to image formation, which decompose by the action of an acid.

For example, the aforementioned two-component resists employing tertiary alkyl ester groups as acid-decomposable groups tend to give a resist pattern which comes to have a T-top surface with the lapse of time from exposure to heat treatment, and it has been difficult to diminish the formation of a T-top surface. This is an intrinsic problem of resists employing acid-decomposable groups which decompose at a low rate by the action of an acid, such as tertiary alkyl ester groups. Specifically, in a resist pattern containing such slowly acid-decomposable groups, there is a large difference between the amount of the acid-decomposable groups decomposed by an acid generated just after exposure and the amount of the acid-decomposable groups decomposed by heat treatment after the exposure. As a result, the resist surface, which is more influenced by contamination with amines contained in the atmosphere and by the diffusion of the acid into the air, is apt to undergo a change in profile, i.e., the formation of a T-top surface, with the lapse of time from exposure to heat treatment. Therefore, it is virtually impossible in single-layer resists to use not-readily acid-decomposable groups, such as tertiary alkyl ester groups, as the only acid-decomposable groups for the purpose of image formation, though there is an exception that the above problem is overcome by regulating the glass transition point of a binder to thereby lower the glass transition point of the whole resist film and by elevating the baking temperature in film formation.

On the other hand, resists containing a silyl ether compound or an acetal compound frequently have the problem that the resist pattern comes to have a reduced line width with the lapse of time from exposure to heat treatment. This phenomenon is thought to occur by the following mechanism. In a resist containing a compound which is acid-decomposable at a high rate, such as a silyl ether or acetal compound, the decomposition of the compound by the acid which has generated just after exposure proceeds to a degree sufficient for image formation. With the lapse of time from exposure to heat treatment, the acid-decomposable compound decomposes due to the horizontal diffusion of the acid and further decomposes gradually at room temperature by the action of the acid remaining in a slight amount in half-exposed areas. As a result, the resist pattern comes to have a reduced line width. It has however been found that the above phenomenon proceeds to different degrees depending on the kinds of photo-acid generators.

However, especially the resists in which such readily acid-decomposable groups are utilized for image formation have been found to have the following new problem besides the problem that the resist pattern comes to have a reduced line width with the lapse of time from exposure to heat treatment. That is, the resist pattern comes to have a deteriorated profile due to residual standing wave, and undergoes collapse as a result of undercut at the interface with the substrate. This new problem has been found to be severer especially in resists containing a photo-acid generator of the above-described sulfonium or iodonium salt type.

The profile deterioration described above is a serious problem which should be overcome in resists containing a sulfonium or iodonium salt type photo-acid generator. This is because these resists specifically have higher sensitivity and higher resolving power than the resists containing any of the other known photo-acid generators, although the reason for this has not been elucidated.

On the other hand, JP-A-5-181279, JP-A-5-323590, and JP-A-6-130666 disclose that the resist profile deterioration which occurs with the lapse of time mainly from exposure to heat treatment can be prevented by using two kinds of photo-acid generators in combination.

For example, in JP-A-5-181279, there is a description to the effect that a resist surface can be inhibited from becoming soluble, i.e., coming to form a T-top surface, with the lapse of time from exposure to heat treatment by using a combination of a compound (photo-acid generator) which generates a strong acid (e.g., a sulfonic acid) upon exposure and a compound which generates a weak acid (e.g., a carboxylic acid) upon exposure.

In JP-A-5-323590 is described a technique for changing the solubility of a resist film in a developing solution after exposure. In this technique, a compound contributing to image formation (photo-acid generator) and a compound not contributing to image formation are used in combination to increase the absolute amount of the acid generated after exposure and thereby reduce the relative amount of the acid consumed in a resist surface layer by impurities present in the atmosphere. Thus, according to the above reference, the resist surface can be inhibited from becoming soluble, i.e., coming to form a T-top surface, with the lapse of time from exposure to heat treatment to thereby obtain heightened resolving power.

In JP-A-6-130666, there is a description to the same effect that use of a combination of a strong acid and a weak acid is effective in inhibiting a resist film from undergoing a change in performance with the lapse of time from exposure to heat treatment.

However, any combination of compounds according to the prior art techniques is insufficient in resolution and in inhibiting a resist pattern from coming to have a reduced line width with the lapse of time from exposure to heat treatment. In addition, those prior art techniques have failed to give satisfactory results from the standpoint of preventing collapse.

As described above, in the prior art techniques, it has not been fully known how to design a positive photosensitive composition which satisfies all the desired properties, i.e., high sensitivity, high resolving power, and freedom from a decrease in resist pattern line width or from the formation of a T-top resist pattern surface with the lapse of time from exposure to heat treatment, and, especially in a resist system utilizing readily acid-decomposable groups for image formation, less profile deterioration such as residual standing wave and collapse.

SUMMARY OF THE INVENTION

Accordingly, an object of the present invention is to eliminate the problems described above and to provide a positive photosensitive composition which has high sensitivity and high resolving power, causes neither a decrease in resist pattern line width nor the formation of a T-top resist pattern surface with the lapse of time from exposure to heat treatment, and does not cause much profile deterioration such as residual standing wave and collapse.

As a result of intensive investigations made by the present inventors while taking account of the properties described above, they have found that the object of the present invention is accomplished with a chemically amplified positive resist containing a combination of a sulfonium salt represented by the following formula (I) or an iodonium salt represented by the following formula (I'), each having a specific counter anion, as a first photo-acid generator and an N-hydroxyimidosulfonate type photo-acid generator represented by the following general formula (II) as a second photo-acid generator.

The present invention provides compositions having the following constitutions.

(A) A positive photosensitive composition comprising:
   a resin having groups capable of decomposing by the action of an acid to enhance solubility of the resin in an alkaline developing solution and
   a compound represented by formula (I) or (I') and a compound represented by formula (II) as compounds capable of generating a sulfonic acid upon irradiation with actinic rays or radiation:

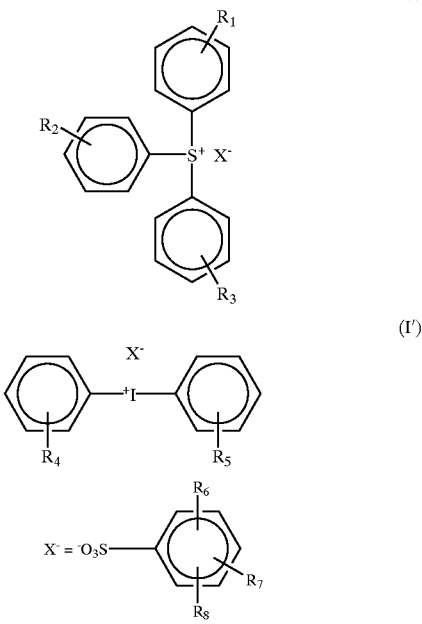

wherein
   $R_1$ to $R_5$, which may be the same or different, each represents a hydrogen atom, an alkyl group, a cycloalkyl group, an alkoxy group, a hydroxy group, a halogen atom, or a group represented by —S—$R_{12}$ where $R_{12}$ represents an alkyl group or an aryl group, and
   $R_6$ to $R_8$, which may be the same or different, each represents a hydrogen atom, an alkyl group, a cycloalkyl group, an alkenyl group, a group represented by —COOR$_{13}$ (wherein $R_{13}$ represents an alkyl group or an alkenyl group), or a group represented by —OCOR$_{14}$ (wherein $R_{14}$ represents an alkyl group or an alkenyl group),
   provided that at least one of $R_6$ to $R_8$ is an alkyl group, a cycloalkyl group, a group represented by —COOR$_{13}$, a group represented by —OCOR$_{14}$, or an alkenyl group, and that when two of $R_6$ to $R_8$ are a hydrogen atom, then the remaining one represents an alkyl group having 6 carbon atoms or more, a cycloalkyl group having 5 carbon atoms or more, an alkenyl group having 6 carbon atoms or more, a group represented by —COOR$_{13}$ (wherein $R_{13}$ is an alkyl or alkenyl group having 5 carbon atoms or more), or a group represented by —OCOR$_{14}$ (wherein $R_{14}$ is an alkyl or alkenyl group having 5 carbon atoms or more);

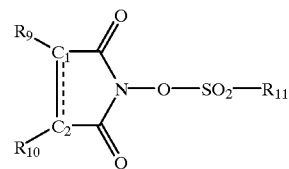

wherein
   $C_1$ and $C_2$ each is a carbon atom and are bonded to each other through a single bond or a double bond,
   $R_9$ and $R_{10}$, which may be the same or different, satisfy any of the following (1) to (4):
   (1) $R_9$ and $R_{10}$ each independently represents a hydrogen atom, an alkyl group, a cycloalkyl group, or an aryl group,
   (2) $R_9$ and $R_{10}$, in combination with $C_1$ and $C_2$, form a mono- or polycyclic group which may contain one or more heteroatoms,
   (3) $R_9$ and $R_{10}$ form a fused aromatic ring containing $C_1$ and $C_2$,
   (4) at least one of $R_9$ and $R_{10}$ represents a residue containing an N-sulfonyloxyimido; and
   $R_{11}$ represents an alkyl group, a halogenated alkyl group, a cycloalkyl group, an alkenyl group, an aryl group which may have substituent(s), an aralkyl group which may have substituent(s), or a camphor group.

(B) The positive photosensitive composition as described in (A) above, which contains a low-molecular acid-decomposable dissolution inhibitive compound having a molecular weight of 3,000 or lower which has groups decomposable by an acid and shows enhanced solubility of the compound in an alkaline developing solution by the action of an acid.

(C) The positive photosensitive composition as described in (A) or (B) above, which contains a resin insoluble in water and soluble in an aqueous alkali solution.

(D) The positive photosensitive composition as described in any one of (A) to (C) above, wherein the resin having groups which decompose by the action of an acid to enhance solubility in an alkaline developing solution has acetal groups as the acid-decomposable groups.

(E) A positive photosensitive composition comprising,
   a compound represented by formula (I) or (I') and a compound represented by formula (II) both described in (A) above, as compounds which generate a sulfonic acid upon irradiation with actinic rays or a radiation,
   a low--molecular acid-decomposable dissolution inhibitive compound having a molecular weight of 3,000 or lower which has groups decomposable by an acid and shows enhanced solubility in an alkaline developing solution by the action of an acid, and a resin insoluble in water and soluble in an aqueous alkali solution.

(F) The positive photosensitive composition as described in any one of (A) to (D) above, which further contains a low-molecular compound having a molecular weight of 1,000 or lower which is insoluble in water and soluble in an aqueous alkali solution.

By the use of a combination of photo-acid generators as described above, i.e., an onium salt type photo-acid generator having a specific counter anion and represented by general formula (I) or (I') described above and an N-sulfonyloxyimido type photo-acid generator represented by general formula (II) described above, it has become possible to obtain a resist completely free from the problem that a resist pattern comes to have a reduced line width or form a T-top surface with the lapse of time from exposure to heat treatment, and from the problem that a resist pattern has residual standing wave and undergoes profile deterioration such as collapse. Thus, it has become possible to obtain a resist pattern having high sensitivity, high resolving power, and an excellent profile. The above are utterly unexpected effects, which are not at all seen in any resist containing either the onium salt type photo-acid generator or the N-hydroxyimidosulfonate type photo-acid generator.

DETAILED DESCRIPTION OF THE INVENTION

The compounds used in the present invention are explained below in detail.

[1] Photo-acid Generator Represented by General Formula (I) or (I')

Examples of the alkyl group represented by $R_1$ to $R_5$ in general formula (I) or (I') include those having 1 to 4 carbon atoms, such as methyl, ethyl, propyl, isopropyl, n-butyl, sec-butyl, and tert-butyl. Examples of the cycloalkyl group include those having 3 to 8 carbon atoms, such as cyclopropyl, cyclopentyl, cyclohexyl, and cyclooctyl. Examples of the alkoxy group include those having 1 to 4 carbon atoms, such as methoxy, ethoxy, propoxy, and butoxy. Examples of the halogen atom include fluorine, chlorine, bromine, and iodine. Examples of the alkyl group represented by $R_{12}$ in —S—$R_{12}$ include those having 1 to 4 carbon atoms, such as methyl, ethyl, propyl, isopropyl, n-butyl, sec-butyl, and tert-butyl, and examples of the aryl group represented by $R_{12}$ include those having 6 to 14 carbon atoms, such as phenyl, tolyl, xylyl, mesityl, and naphthyl.

Examples of the alkyl group represented by $R_6$ to $R_8$ include linear or branched alkyl groups having 1 to 20 carbon atoms. In the case where two of $R_6$ to $R_8$ each is a hydrogen atom (e.g., $R_6$ is an alkyl group and $R_7$ and $R_8$ each is a hydrogen atom), then the alkyl group represented by the remaining one is preferably a linear or branched alkyl group having at least 6, preferably 6 to 20, more preferably 6 to 16 carbon atoms. A branched alkyl group having 6 to 16 carbon atoms is especially preferred from the standpoint of preventing the decrease in resist pattern line width which occurs with the lapse of time from exposure to heat treatment. If the alkyl group has 5 or less carbon atoms, sufficient solubility in ordinary resist solvents cannot be obtained. If the alkyl group has 21 or more carbon atoms, sensitivity and resolving power are reduced.

In the case where only one of $R_6$ to $R_8$ is a hydrogen atom or none of these is a hydrogen atom (e.g., in the case where $R_6$ is a hydrogen atom and $R_7$ and $R_8$ each is an alkyl group or where $R_6$ to $R_8$ each is an alkyl group), then the alkyl groups represented by the remaining two or all of $R_6$ to $R_8$ each is preferably a linear or branched alkyl group having 1 to 16, more preferably 1 to 14 carbon atoms. In particular, a linear or branched alkyl group having 1 to 12 carbon atoms is especially preferred from the standpoint of sensitivity. If the alkyl group has 17 or more carbon atoms, sensitivity and resolving power are reduced.

Examples of the cycloalkyl group represented by $R_6$ to $R_8$ include those having 3 to 20 carbon atoms. However, in the case where two of $R_6$ to $R_8$ each is a hydrogen atom (e.g., $R_6$ is a cycloalkyl group and $R_7$ and $R_8$ each is a hydrogen atom), then the cycloalkyl group represented by the remaining one has 5 or more, preferably 5 to 20, more preferably 5 to 16 carbon atoms. If the cycloalkyl group has 4 or less carbon atoms, sufficient solubility in ordinary resist solvents cannot be obtained. If the cycloalkyl group has 21 or more carbon atoms, sensitivity and resolving power are reduced.

In the case where only one of $R_6$ to $R_8$ is a hydrogen atom or none of these is a hydrogen atom (e.g., in the case where $R_6$ is a hydrogen atom and $R_7$ and $R_8$ each is a cycloalkyl group or where $R_6$ to $R_8$ each is a cycloalkyl group), then the cycloalkyl groups represented by the remaining two-or all of $R_6$ to $R_8$ each is preferably a cycloalkyl group having 3 to 16, more preferably 3 to 14 carbon atoms. In particularly, a cycloalkyl group having 3 to 12 carbon atoms is preferred especially from the standpoint of sensitivity. If the cycloalkyl group has 17 or more carbon atoms, sensitivity and resolving power are reduced.

Examples of the alkenyl group represented by $R_6$ to $R_8$ include linear or branched alkenyl groups having 2 to 20 carbon atoms. In the case where two of $R_6$ to $R_8$ each is a hydrogen atom (e.g., $R_6$ is an alkenyl group and $R_7$ and $R_8$ each is a hydrogen atom), then the alkenyl group represented by the remaining one is a linear or branched alkenyl group having 6 or more, preferably 6 to 20, more preferably 6 to 16 carbon atoms. If the alkenyl group has 5 or less carbon atoms, sufficient solubility in ordinary resist solvents cannot be obtained. If the alkenyl group has 21 or more carbon atoms, sensitivity and resolving power are reduced.

In the case where only one of $R_6$ to $R_8$ is a hydrogen atom or none of these is a hydrogen atom (e.g., in the case where $R_6$ is a hydrogen atom and $R_7$ and $R_8$ each is an alkenyl group or where $R_6$ to $R_8$ each is an alkenyl group), then the alkenyl groups represented by the remaining two or all of $R_6$ to $R_8$ each is preferably a linear or branched alkenyl group having 2 to 16, more preferably 2 to 14 carbon atoms. In particular, a linear or branched alkenyl group having 2 to 12 carbon atoms is preferred especially from the standpoint of sensitivity. If the alkenyl group has 17 or more carbon atoms, sensitivity and resolving power are reduced.

Examples of the alkyl group represented by $R_{13}$ and $R_{14}$ in —COOR$_{13}$ and —OCOR$_{14}$ both represented by $R_6$ to $R_8$ include linear or branched alkyl groups having 1 to 20 carbon atoms. In the case where two of $R_6$ to $R_8$ each is a hydrogen atom (e.g., $R_6$ is a group represented by —COOR$_{13}$ and $R_7$ and $R_8$ each is a hydrogen atom), then the alkyl group represented by $R_{13}$ or $R_{14}$ contained in the remaining one is a linear or branched alkyl group having 5 or more, preferably 6 to 20, more preferably 6 to 16 carbon atoms. If the alkyl group has 4 or less carbon atoms, sufficient solubility in ordinary resist solvents cannot be obtained. If the alkyl group has 21 or more carbon atoms, sensitivity and resolving power are reduced.

In the case where one of $R_6$ to $R_8$ is a hydrogen atom or none of these is a hydrogen atom (e.g., in the case where $R_6$ is a hydrogen atom and $R_7$ and $R_8$ each is a group represented by —COOR$_{13}$ or where R$_6$ to R$_8$ each is a group represented by —COOR$_{13}$), then the alkyl group represented by R$_{13}$ or R$_{14}$ in each of the remaining two or all of R$_6$ to R$_8$ is preferably a linear or branched alkyl group having 1 to 16, more preferably 1 to 14 carbon atoms. In particular, a linear or branched alkyl group having 1 to 12 carbon atoms is preferred especially from the standpoint of sensitivity. If the alkyl group has 17 or more carbon atoms, sensitivity and resolving power are reduced.

Examples of the alkenyl group represented by R$_{13}$ and R$_{14}$ in —COOR$_{13}$ and —OCOR$_{14}$ both represented by R$_6$ to R$_8$ include linear or branched alkenyl groups having 2 to 20 carbon atoms. In the case where two of R$_6$ to R$_8$ each is a hydrogen atom (e.g., R$_6$ is a group represented by —COOR$_{13}$ and R$_7$ and R$_8$ each is a hydrogen atom), then the alkenyl group represented by R$_{13}$ or R$_{14}$ contained in the remaining one is a linear or branched alkenyl group having 5 or more, preferably 6 to 20, more preferably 6 to 16 carbon atoms. If the alkenyl group has 4 or less carbon atoms, sufficient solubility in ordinary resist solvents cannot be obtained. If the alkenyl group has 21 or more carbon atoms, sensitivity and resolving power are reduced.

In the case where one of R$_6$ to R$_8$ is a hydrogen atom or none of these is a hydrogen atom (e.g., in the case where R$_6$ is a hydrogen atom and R$_7$ and R$_8$ each is a group represented by —COOR$_{13}$ or where R$_6$ to R$_8$ each is a group represented by —COOR$_{13}$), then the alkenyl group represented by R$_{13}$ or R$_{14}$ in each of the remaining two or all of R$_6$ to R$_8$ is preferably a linear or branched alkenyl group having 2 to 16, more preferably 2 to 14 carbon atoms. In particular, a linear or branched alkenyl group having 2 to 12 carbon atoms is preferred especially from the standpoint of sensitivity. If the alkenyl group has 17 or more carbon atoms, sensitivity and resolving power are reduced.

In the case where one of R$_6$ to R$_8$ is a substituent (i.e., one is not a hydrogen atom and the others are hydrogen atoms), preferred examples of the substituent include branched alkyl groups having 6 to 16 carbon atoms and groups represented by —COOR$_{13}$ wherein R$_{13}$ is a linear or branched, alkyl or alkenyl group having 6 to 16 carbon atoms. In the case where two or all of R$_6$ to R$_8$ each is a substituent (i.e., two or all of R$_6$ to R$_8$ are not a hydrogen atom), preferred examples of the substituents include linear or branched alkyl groups having 1 to 12 carbon atoms, groups represented by —COOR$_{13}$ wherein R$_{13}$ is a linear or branched alkyl group having 1 to 12 carbon atoms, and groups represented by —OCOR$_{14}$ wherein R$_{14}$ is a linear or branched alkyl group having 1 to 12 carbon atoms.

The content of the photo-acid generator represented by general formula (I) or (I') in the composition is desirably from 0.05 to 20% by weight based on the total amount of all solid components. The content thereof is preferably from 0.1 to 10% by weight, more preferably from 0.2 to 7% by weight.

The photo-acid generators represented by general formula (I) or (I') are used alone or in combination of two or more thereof.

Specific examples of these compounds are shown below as (I-1) to (I-26) and (I'-1) to (I'-15). However, the photo-acid generator represented by general formula (I) or (I') should not be construed as being limited thereto.

1)

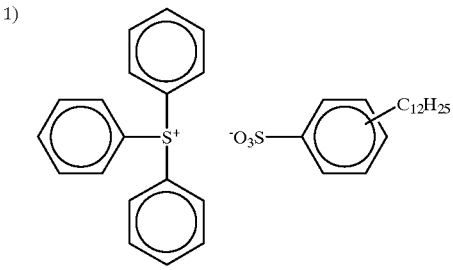

[I-1]

1) The C$_{12}$ alkyl group is a residue having any of various branched structures.

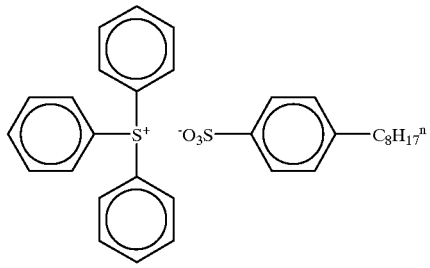

[I-2]

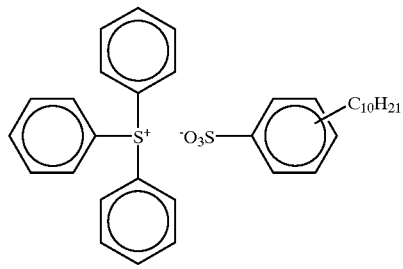

[I-3]

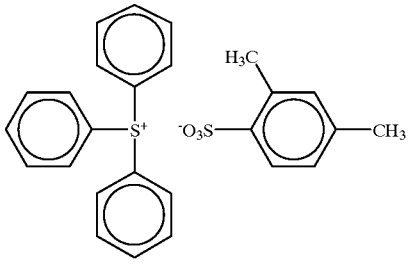

[I-4]

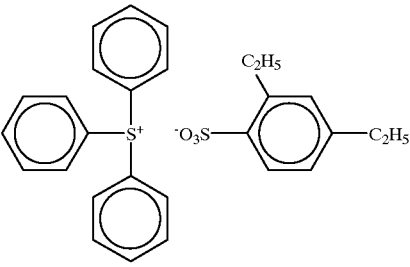

[I-5]

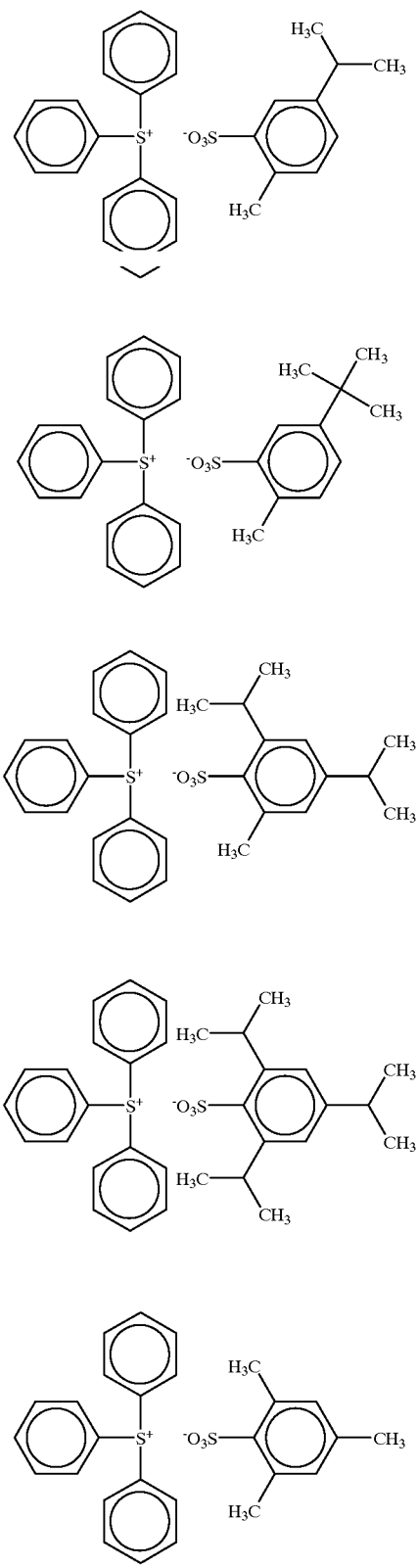
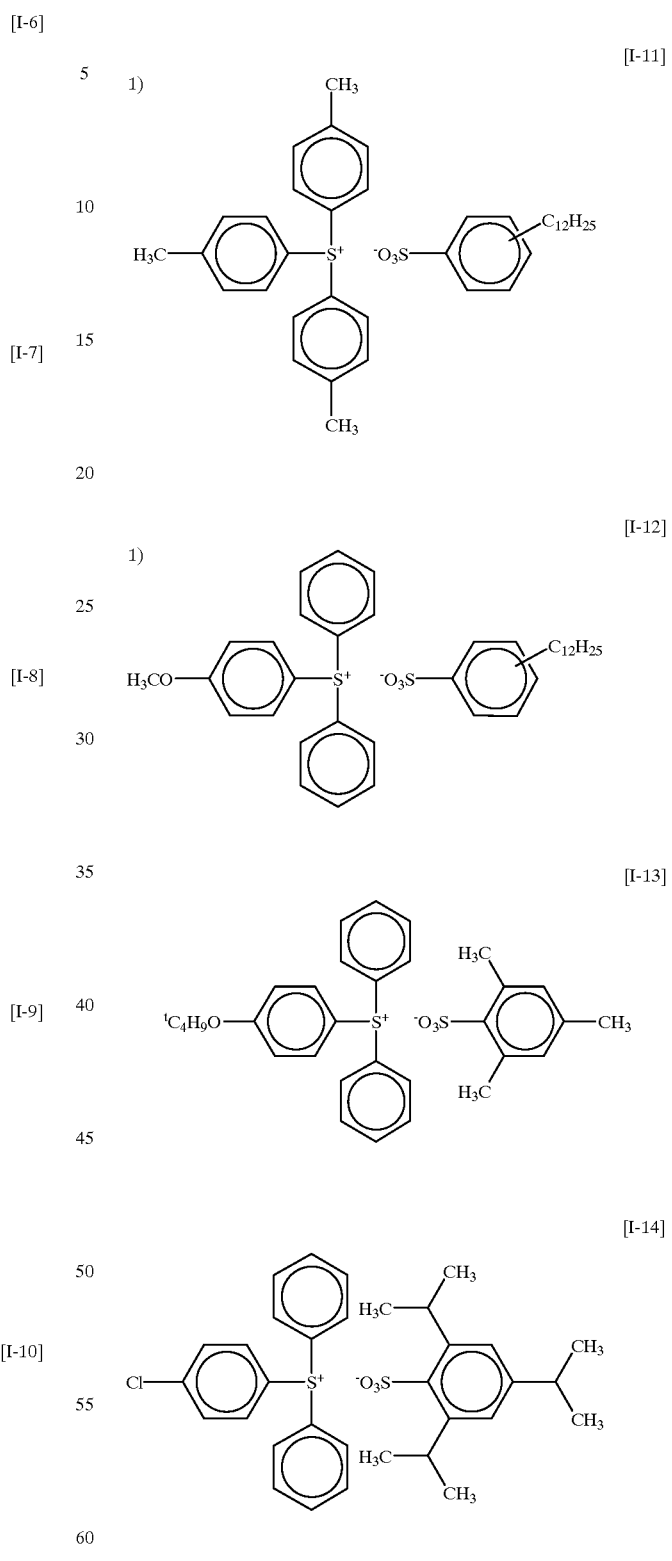

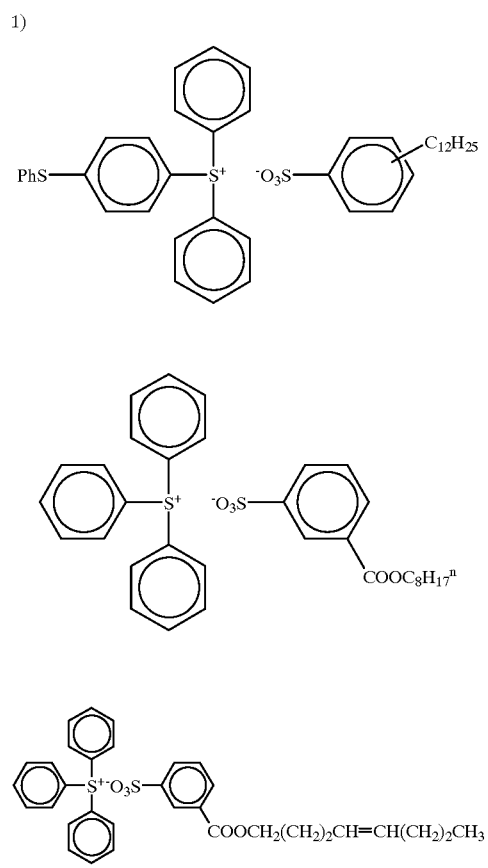
[I-15]
[I-16]
[I-17]
[I-18]
[I-19]
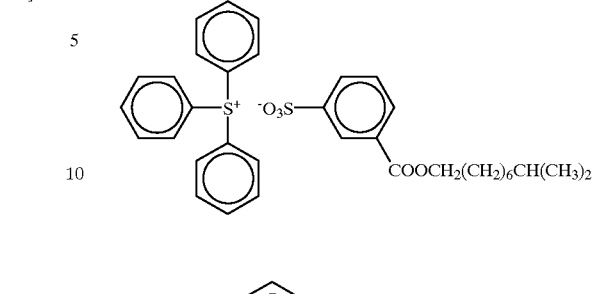
[I-20]
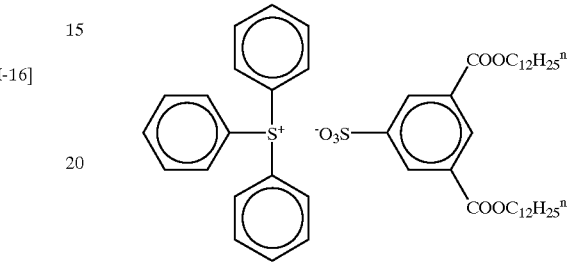
[I-21]
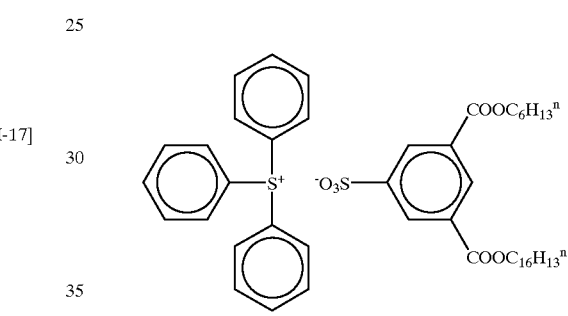
[I-22]
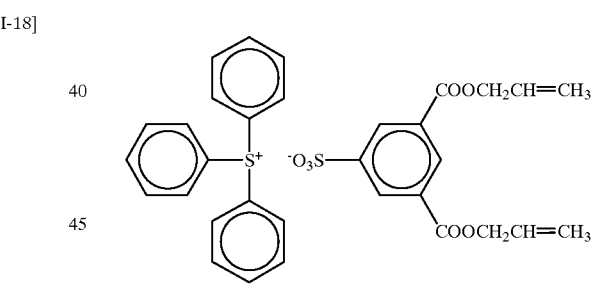
[I-23]
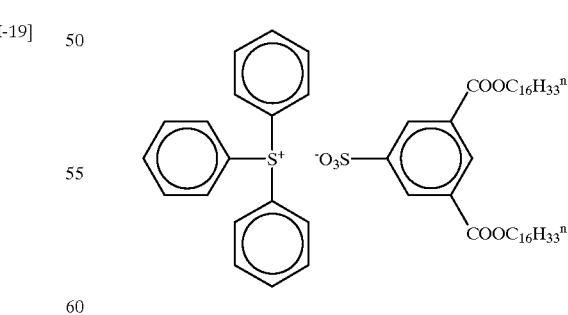
[I-24]

[I-22]
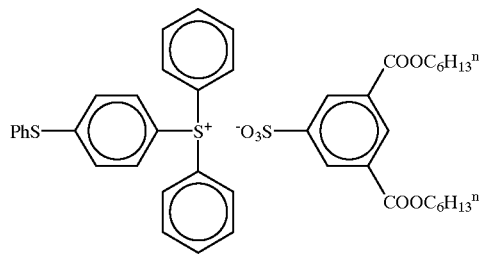
[I-26]
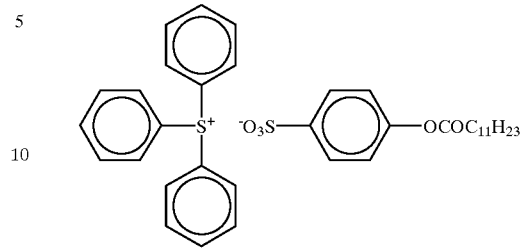
2) The $C_{11}$ alkyl group is linear or consists of a mixture of branched alkyl groups of various structures.
[I'-1]
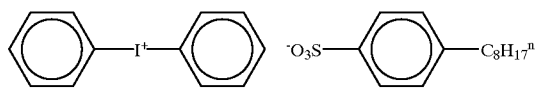
[I'-2]
1)
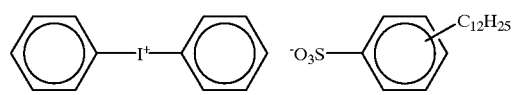
[I'-3]
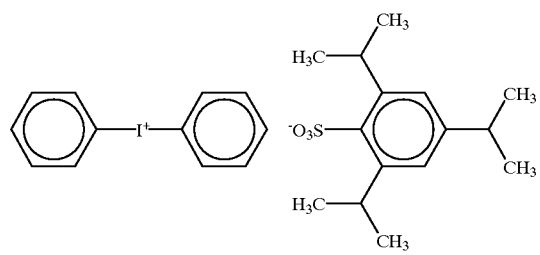
[I'-4]
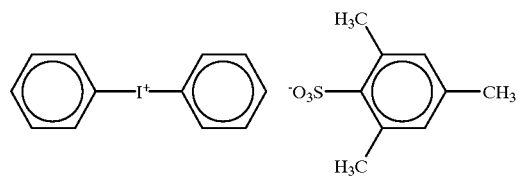
[I'-5]
1)
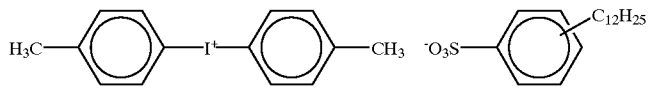
[I'-6]
1)
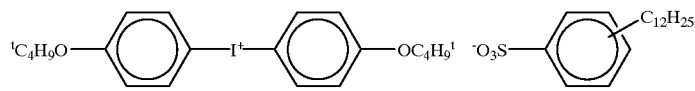

-continued
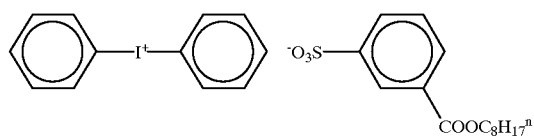
[I'-7]
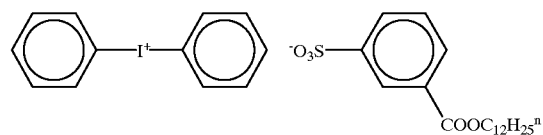
[I'-8]
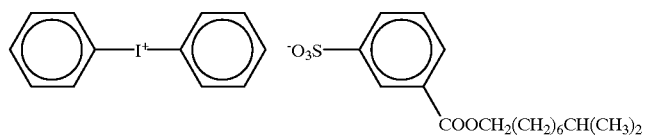
[I'-9]
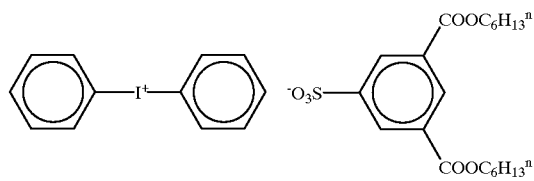
[I'-10]
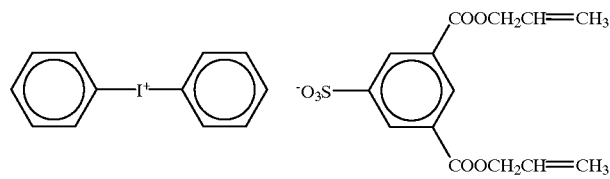
[I'-11]
2)
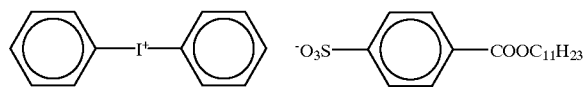
[I'-12]
2)
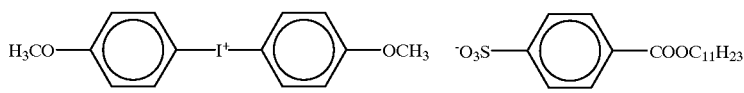
[I'-13]
2)
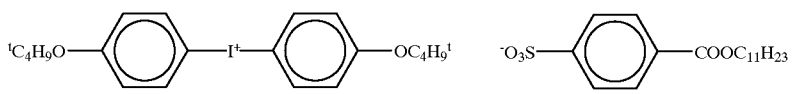
[I'-14]
2)
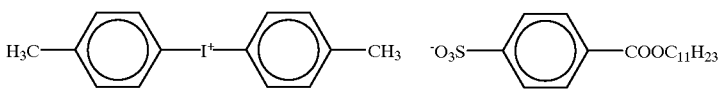
[I'-15]
[2] Photo-acid Generator Represented by General Formula (II)
When $R_9$ and $R_{10}$ in general formula (II) are in case (1), examples of the alkyl group include those having 1 to 4 carbon atoms, such as methyl, ethyl, propyl, isopropyl, n-butyl, sec-butyl, and tert-butyl. Examples of the cycloalkyl group include those having 3 to 8 carbon atoms, such as cyclopropyl, cyclopentyl, cyclohexyl, and cyclooctyl. Examples of the aryl group include those having 6 to 14 carbon atoms, such as phenyl, tolyl, xylyl, mesityl, and naphthyl.

When $R_9$ and $R_{10}$ are in case (3), examples thereof include the following structures.

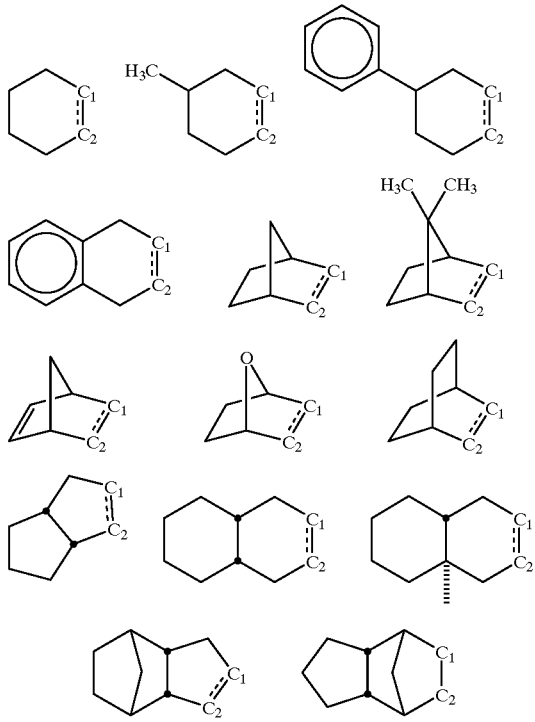

When $R_9$ and $R_{10}$ are in case (3), examples thereof include the following structures.

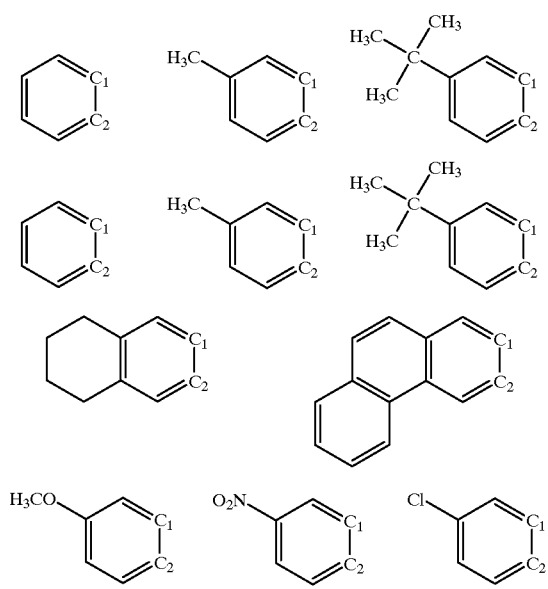

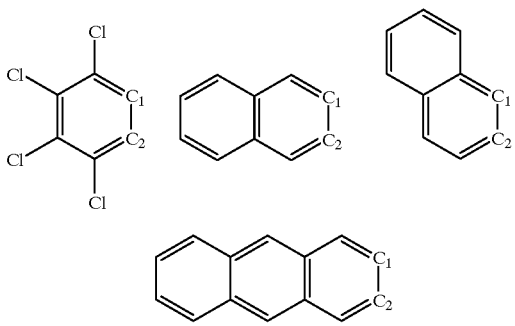

When $R_9$ and $R_{10}$ are in case (4), examples thereof include the structures enumerated above with regard to cases (1) to (3) which each further has at least one N-sulfonyloxyimido residues each bonded thereto through a single bond or any of the following divalent organic groups. The following connecting groups are used alone or in combination of two or more thereof.

Examples of the divalent organic group include:
—O—, —S—, —SO—, —SO$_2$—, —NH—, —CO—, —CO$_2$—, —NHSO$_2$—, —NHCO—, —NHCO$_2$—, and

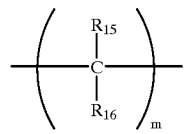

(wherein $R_{15}$ and $R_{16}$ each represents a hydrogen atom or a methyl group). In case (4), the compounds of formula (II) have at least two N-sulfonyloxyimido structures as in Compounds (II-33) to (II-35) exemplified below.

Examples of the alkyl group represented by $R_{11}$ in general formula (II) include linear or branched alkyl groups having 1 to 20, preferably 1 to 16, more preferably 1 to 12 carbon atoms. Alkyl groups having 21 or more carbon atoms are undesirable in that sensitivity and resolving power are reduced.

Examples of the halogenated alkyl group include the aforementioned alkyl groups in each of which at least one hydrogen atom has been replaced with a halogen atom. Examples of the substituent halogen atom include fluorine, chlorine, bromine, and iodine, preferably fluorine, chlorine, and bromine, more preferably fluorine. The alkyl group may contain two or more kinds of halogen atoms.

Examples of the cycloalkyl group include those having 3 to 12 carbon atoms, such as cyclopropyl, cyclopentyl, cyclohexyl, and cyclooctyl, and further include polycyclic substituents such as norbornyl, adamantyl, and tricyclodecanyl.

Examples of the alkenyl group include linear or branched alkenyl groups having 1 to 20, preferably 1 to 16, more preferably 1 to 12 carbon atoms. Alkenyl groups having 21 or more carbon atoms are undesirable in that sensitivity and resolving power are reduced.

Examples of the aryl group represented by $R_{11}$ include phenyl and naphthyl. Examples of the aralkyl group include benzyl. Examples of the substituent for the aryl and aralkyl groups include lower alkyl groups such as methyl, ethyl, propyl, isopropyl, and tert-butyl, cycloalkyl groups such as cyclopentyl and cyclohexyl, aryl groups such as phenyl, toluyl, xylyl, and mesityl, lower alkoxy groups such as methoxy, ethoxy, propoxy, isopropoxy, sec-butoxy, and tert-butoxy, alkenyl groups such as vinyl, allyl, propenyl, and butenyl, acyl groups such as formyl and acetyl, other groups such as hydroxy, carboxy, cyano, and nitro, and halogen atoms such as fluorine, chlorine, bromine, and iodine. Preferred among these are lower alkyl groups such as methyl, ethyl, propyl, isopropyl, and tert-butyl, cyclohexyl, phenyl, toluyl, lower alkoxy groups such as methoxy, ethoxy, propoxy, isopropoxy, sec-butoxy, and tert-butoxy, cyano, nitro, and halogen atoms such as fluorine, chlorine, bromine, and iodine. The aryl group and the aralkyl group may have two or more kinds of substituents. The camphor group represented by $R_{11}$ is as shown in Compound (II-20) exemplified below.

The content of the photo-acid generator represented by general formula (II) is desirably from 0.05 to 20% by weight based on the total amount of all solid components. The content thereof is preferably from 0.1 to 10% by weight, more preferably from 0.2 to 7% by weight.

The proportion of the photo-acid generator represented by general formula (II) to that represented by general formula (I) or (I')(weight ratio of (II)/((I) or (I'))) is preferably from 1/99 to 99/1, more preferably from 5/95 to 95/5, most preferably from 10/90 to 90/10. If the proportion of either photo-acid generator is below 1%, the effects of the present invention are not obtained.

Specific examples of the compound represented by general formula (II) are shown below as (II-1) to (II-35). However the photo-acid generator represented by general formula (II) should not be construed as being limited thereto.

[II-1]
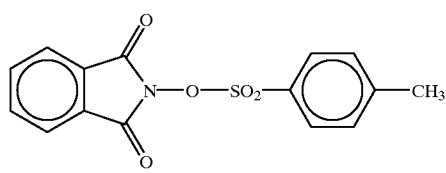

[II-2]
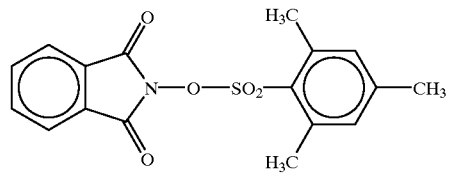

[II-3]
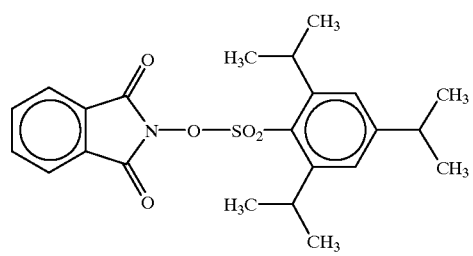

[II-4]
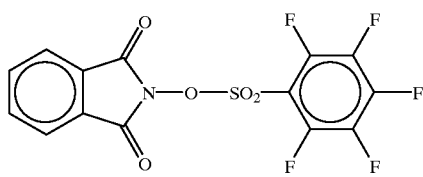

[II-5]
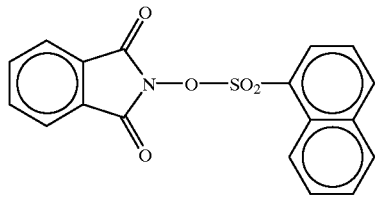

[II-6]
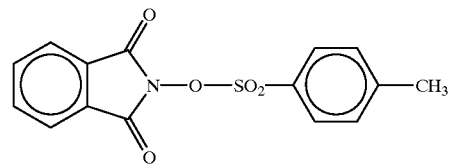

[II-7]
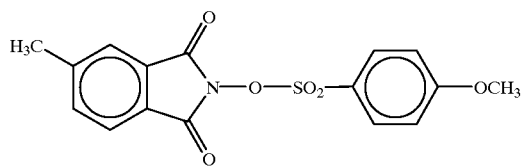

[II-8]
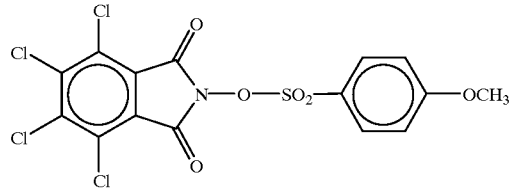

[II-9]
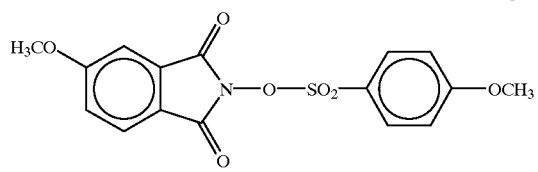

[II-10]
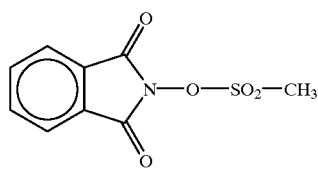

-continued
[II-11] 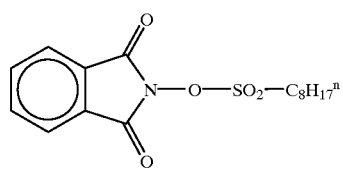
[II-12] 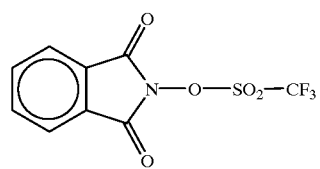
[II-13] 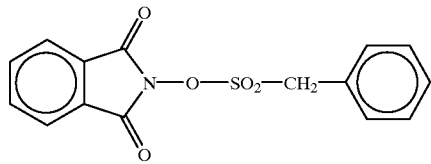
[II-14] 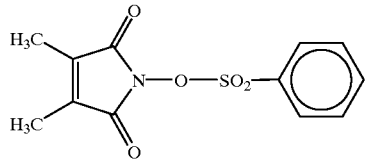
[II-15] 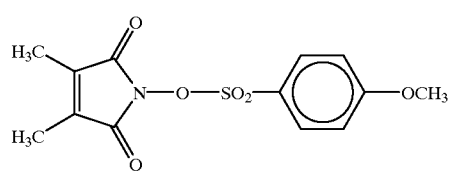
[II-16] 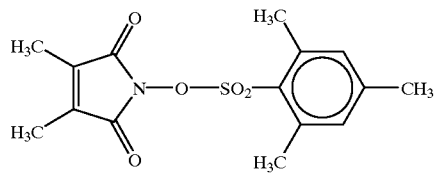
[II-17] 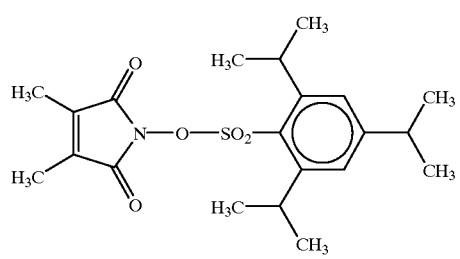
[II-18] 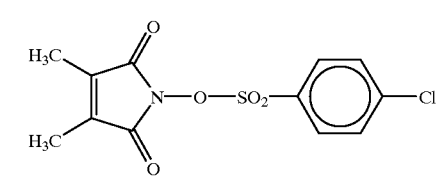
[II-19] 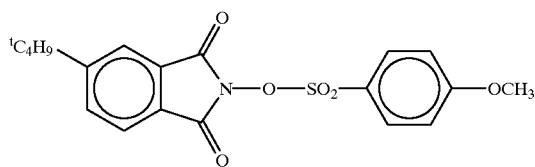
[II-20] 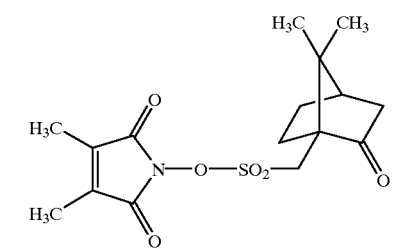
[II-21] 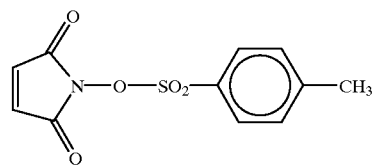
[II-22] 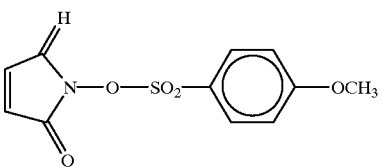
[II-23]
[II-24]

-continued

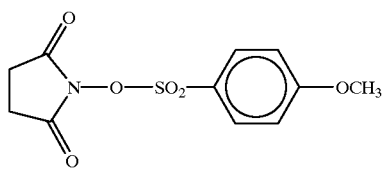
[II-25]

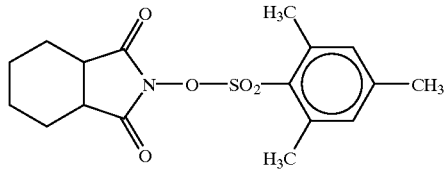
[II-26]

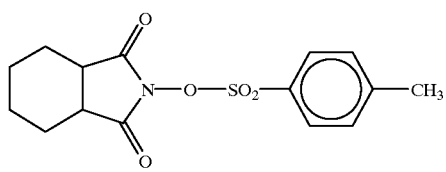
[II-27]

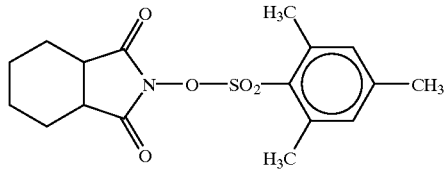
[II-28]

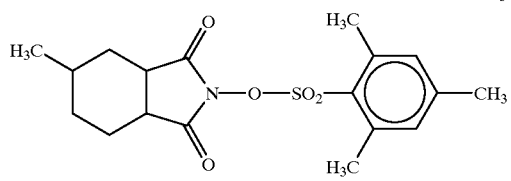
[II-29]

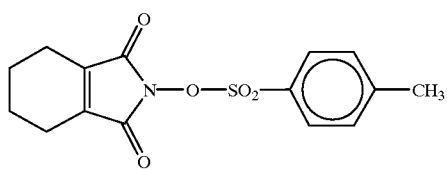
[II-30]

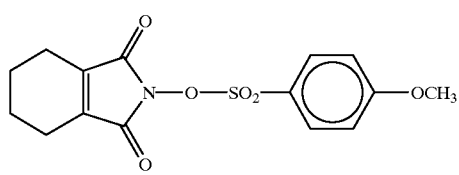
[II-31]

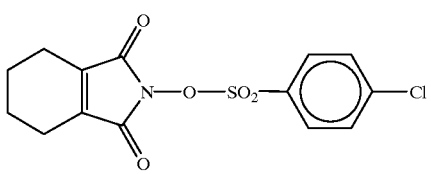
[II-32]

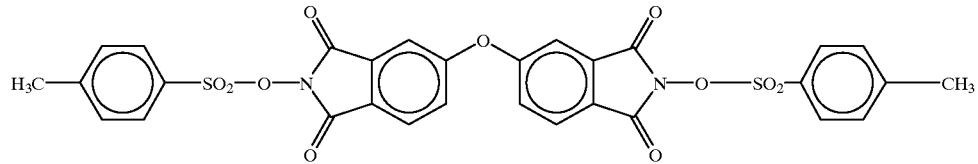
[II-33]

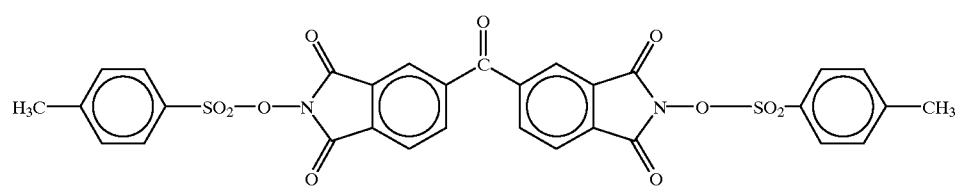
[II-34]

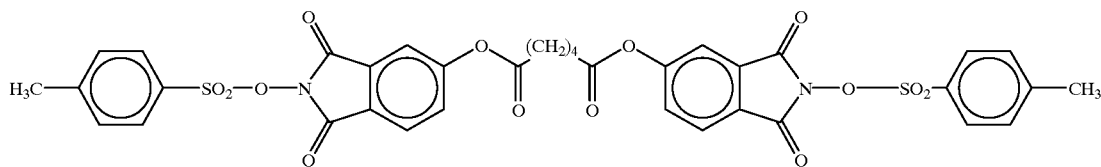
[II-35]

[3] Other Usable Photo-acid Generators

The compound represented by general formula (I) or (I') and the compound represented by general formula (II) may be used in combination with one or more other compounds which decompose upon irradiation with actinic rays or a radiation to generate an acid.

The proportion of the optionally usable photo-acid generators to the sum of the photo-acid generator represented by general formula (I) or (I') and that represented by general formula (II) to be used according to the present invention (weight ratio) is 60/40 or below, preferably 40/60 or below, more preferably 20/80 or below. If the proportion of the photo-acid generators according to the present invention is below 40/60, the effects of the present invention are not sufficiently produced and satisfactory results cannot be obtained.

Examples of such photo-acid generators usable in combination with the specific photo-acid generator include photoinitiators for cationic photopolymerization, photoinitiators for radical photopolymerization, photodecolorants for dyes, optical color changers, and known compounds which generate an acid by the action of light and are used in microresists, etc. These optional photo-acid generators may be suitably used either alone or as a mixture of two or more thereof.

Specific examples thereof include onium salts such as: the diazonium salts described in, e.g., S. I. Schlesinger, *Photogr. Sci. Eng.*, 18, 387 (1974) and T. S. Bal et al., *Polymer*, 21, 423 (1980); the ammonium salts described in, e.g., U.S. Pat. Nos. 4,069,055 and 4,069,056, U.S. Reissued Pat. No. 27,992, and Japanese Patent Application No. 3-140,140; the phosphonium salts described in, e.g., D. C. Necker et al., *Macromolecules*, 17, 2468 (1984), C. S. Wen et al., *Teh, Proc. Conf. Rad. Curing ASIA*, p. 478 Tokyo, October (1988), and U.S. Pat. Nos. 4,069,055 and 4,069,056; the iodonium salts described in, e.g., J. V. Crivello et al., *Macromolecules*, 10 (6), 1307 (1977), *Chem. & Eng. News*, November 28, p. 31 (1988), European Patent 104,143, U.S. Pat. Nos. 339,049 and 410,201, JP-A-2-150,848, and JP-A-2-296,514; the sulfonium salts described in, e.g., J. V. Crivello et al., *Polymer J.*, 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci., Polymer Chem. Ed.*, 17, 2877 (1979), European Patents 370,693, 3,902,114, 233,567, 297,443, and 297,442, U.S. Pat. Nos. 4,933,377, 161,811, 410,201, 339, 049, 4,760,013, 4,734,444, and 2,833,827, and German Patents 2,904,626, 3,604,580, and 3,604,581; the selenonium salts described in, e.g., J. V. Crivello et al., *Macromolecules*, 10 (6), 1307 (1977) and J. V. Crivello et al., *J. Polymer Sci., Polymer Chem. Ed.*, 17, 1047 (1979); and the arsonium salts described in, e.g., C. S. Wen et al., *Teh, Proc. Conf. Rad. Curing ASIA*, p. 478 Tokyo, October (1988). Specific examples thereof further include the organohalogen compounds described in, e.g., U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; the organometallic compound/organic halide combinations described in, e.g., K. Meier et al., *J. Rad. Curing*, 13 (4), 26 (1986), T. P. Gill et al., Inorg. Chem., 19, 3007 (1980), *D. Astruc, Acc. Chem. Res.*, 19 (12), 377 (1896), and JP-A-2-161445; the photo-acid generators having an o-nitrobenzyl type protective group described in, e.g., S. Hayase et al., *J. Polymer Sci.*, 25, 753 (1987), E. Reichmanis et al., *J. Polymer Sci., Polymer Chem. Ed.*, 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem Soc.*, 3571 (1965), P. M. Collins et al., *J. Chem. Soc., Perkin I*, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Soc., Chem. Commun.*, 532 (1972), S. Hayase et al., *Macromolecules*, 18, 1799 (1985), E. Reichmanis et al., *J. Electrochem. Soc., Solid State Sci. Technol.*, 130 (6), F. M. Houlihan et al., *Macromolecules*, 21, 2001 (1988), European Patents 0,290, 750, 046,083, 156,535, 271,851, and 0,388, 343, U.S. Pat. Nos. 3,901,710 and 4,181,531, JP-A-60-198538, and JP-A-53-133022; compounds which photodecompose to generate a sulfonic acid and are represented by the iminosulfonates described in, e.g., M. Tunooka et al., *Polymer Preprints*, Japan, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints*, Japan, 37 (3), European Patents 0,199,672, 84,515, 199,672, 044, 115, and 0,101,122, U.S. Pat. Nos. 618,564, 4,371,605, and 4,431,774, JP-A-64-18143, JP-A-2-245756, and Japanese Patent Application No. 3-140109; and the disulfone compounds described in, e.g., JP-A-61-166544.

Further, a compound obtained by incorporating such groups or compounds which generate an acid by the action of light into the backbone or side chains of a polymer can be used. Examples of this polymeric compound are given in, e.g., M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem., Rapid Commun.*, 9,625 (1988), Y. Yamada et al., *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Also usable are the compounds which generate an acid by the action of light as described in, e.g., V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778, and European Patent 126,712.

Of the optionally usable compounds enumerated above which generate an acid upon irradiation with actinic rays or a radiation, especially effective compounds are explained below. (1) Trihalomethyl-substituted oxazole derivatives represented by the following general formula (PAG1) and trihalomethyl-substituted s-triazine derivatives represented by the following general formula (PAG2).

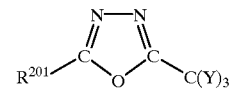

(PAG1)

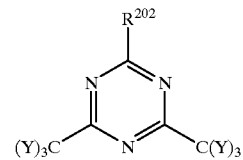

(PAG2)

In the above formulae, $R^{201}$ represents a substituted or unsubstituted aryl or alkenyl group; $R^{202}$ represents a substituted or unsubstituted aryl, alkenyl, or alkyl group or —C(Y)$_3$; and Y represents a chlorine or bromine atom.

Specific examples thereof are given below, but the compounds represented by general formula (PAG1) or (PAG2) should not be construed as being limited thereto.

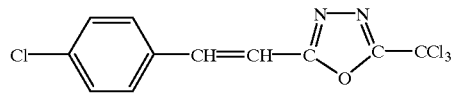

(PAG1-1)

-continued
(PAG1-2)
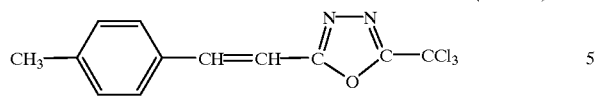
(PAG1-3)
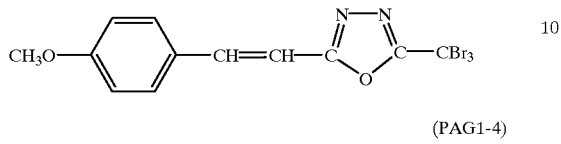
(PAG1-4)
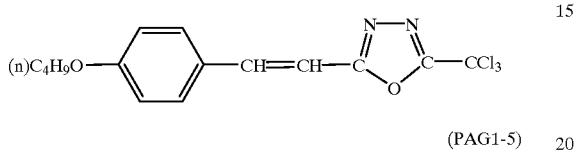
(PAG1-5)
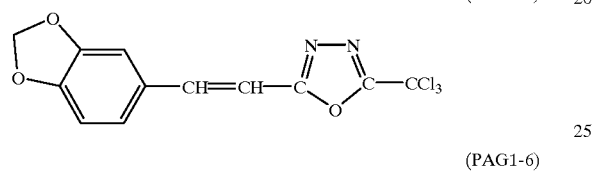
(PAG1-6)
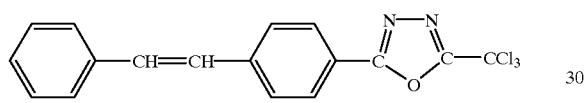
(PAG1-7)
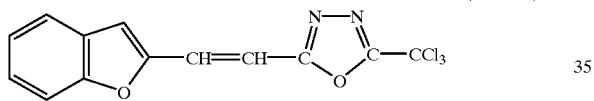
(PAG1-8)
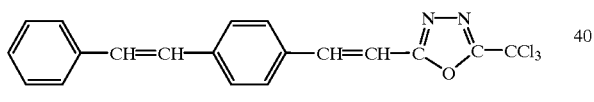
(PAG2-1)
(PAG2-2)
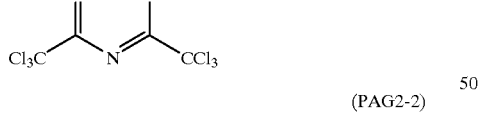
-continued
(PAG2-3)
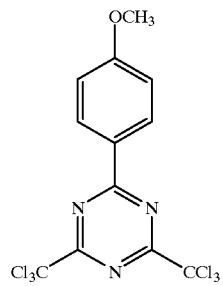
(PAG2-4)
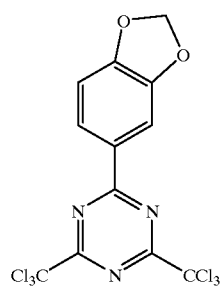
(PAG2-5)
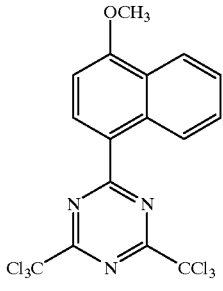
(PAG2-6)
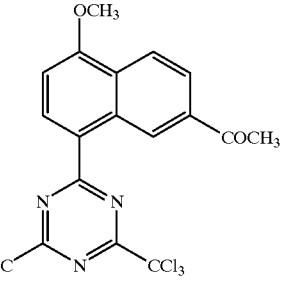
(PAG2-7)
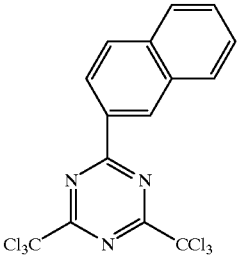

-continued (PAG2-8)
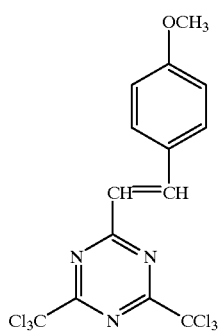

(PAG2-9)
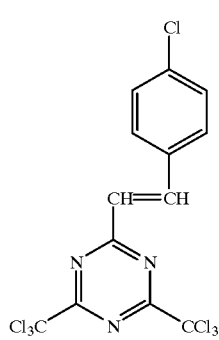

(PAG2-10)
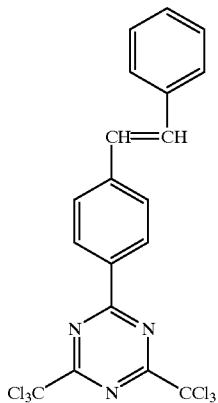

(2) Iodonium salts represented by the following general formula (PAG3) and sulfonium salts represented by the following general formula (PAG4).

(PAG3)

(PAG4)
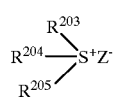

In the above formulae, $Ar^1$ and $Ar^2$ each independently represents a substituted or unsubstituted aryl group. Preferred substituents include alkyl groups, haloalkyl groups, cycloalkyl groups, aryl groups, alkoxy groups, nitro, carboxyl, alkoxycarbonyl groups, hydroxy, mercapto, and halogen atoms.

$R^{203}$, $R^{204}$, and $R^{205}$ each independently represents a substituted or unsubstituted alkyl or aryl group, and preferably represents an aryl group having 6 to 14 carbon atoms, an alkyl group having 1 to 8 carbon atoms, or a substitution derivative thereof. Preferred substituents for the aryl group include alkoxy groups having 1 to 8 carbon atoms, alkyl groups having 1 to 8 carbon atoms, nitro, carboxyl, hydroxy, and halogen atoms. Preferred substituents for the alkyl group include alkoxy groups having 1 to 8 carbon atoms, carboxyl, and alkoxycarbonyl groups.

$Z^-$ represents a counter anion, specifically a perfluoroalkanesulfonate anion, e.g., $CF_3SO_3^-$, or a pentafluorobenzenesulfonate anion.

Two of $R^{203}$, $R^{204}$, and $R^{205}$ may be bonded to each other through a single bond or substituent thereof. $Ar^1$ and $Ar^2$ may be bonded to each other likewise.

Specific examples thereof are given below, but the compounds represented by general formula (PAG3) or (PAG4) should not be construed as being limited thereto.

(PAG3-1)
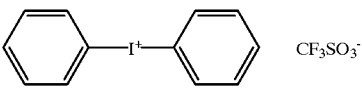

(PAG3-2)

(PAG3-3)
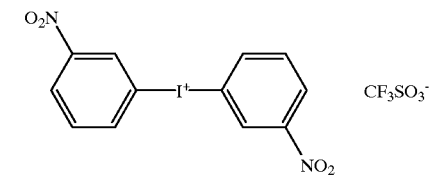

(PAG3-4)
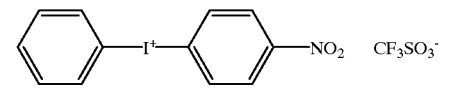

(PAG3-5)
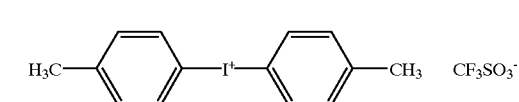

(PAG3-6)
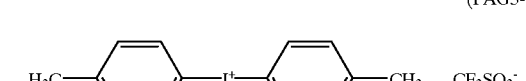

(PAG3-7)
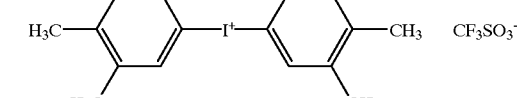

(PAG3-8)
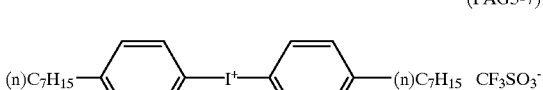

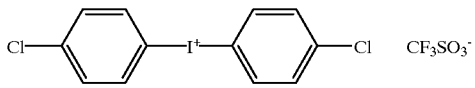

(PAG3-9)
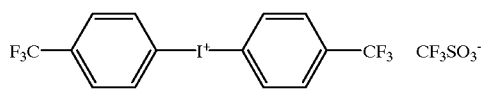 CF₃SO₃⁻
(PAG3-10)
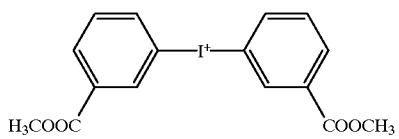 CF₃SO₃⁻
(PAG3-11)
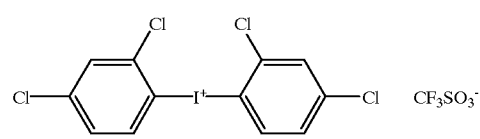 CF₃SO₃⁻
(PAG3-12)
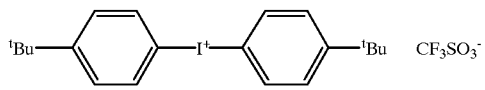 CF₃SO₃⁻
(PAG3-13)
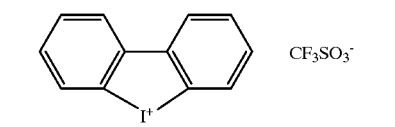 CF₃SO₃⁻
(PAG3-14)
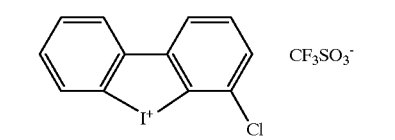 CF₃SO₃⁻
(PAG3-15)
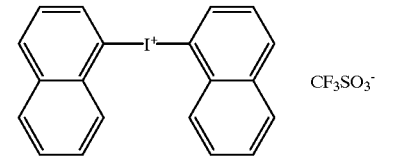 CF₃SO₃⁻
(PAG3-16)
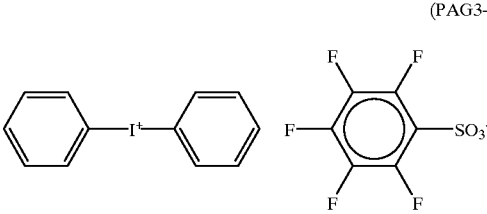
(PAG3-17)
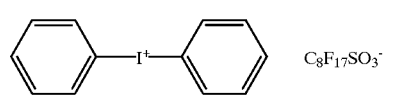 C₈F₁₇SO₃⁻
(PAG4-1)
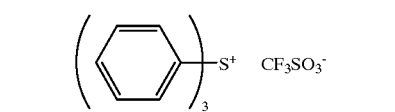 CF₃SO₃⁻
(PAG4-2)
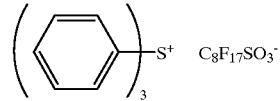 C₈F₁₇SO₃⁻
(PAG4-3)
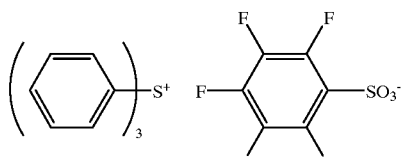
(PAG4-4)
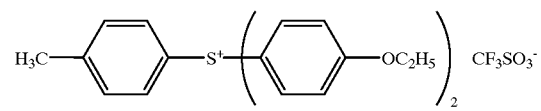 CF₃SO₃⁻
(PAG4-5)
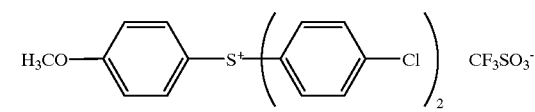 CF₃SO₃⁻
(PAG4-6)
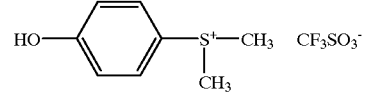 CF₃SO₃⁻
(PAG4-7)
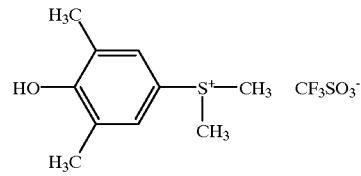 CF₃SO₃⁻
(PAG4-8)
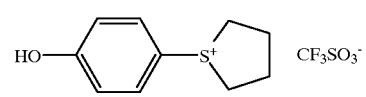 CF₃SO₃⁻
(PAG4-9)
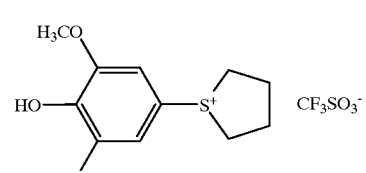 CF₃SO₃⁻
(PAG4-10)
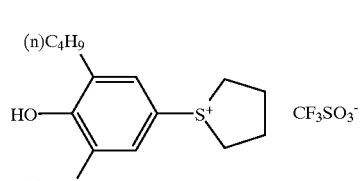 CF₃SO₃⁻
(PAG4-11)
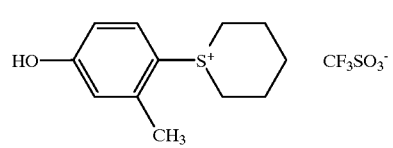 CF₃SO₃⁻

The onium salts represented by general formulae (PAG3) and (PAG4) are known. They can be synthesized, for example, by the methods described in, e.g., J. W. Knapczyk et al., *J. Am. Chem. Soc.*, 91, 145 (1969), A. L. Maycok et al., *J. Org. Chem.*, 35, 2535 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473, and JP-A-53-101331.

(3) Disulfone derivatives represented by the following general formula (PAG5)

$$Ar^3-SO_2-SO_2-Ar^4$$

In the above formulae, $Ar^3$ and $Ar^4$ each independently represents a substituted or unsubstituted aryl group.

Specific examples thereof are given below, but the compounds represented by general formula (PAG5) should not be construed as being limited thereto.

(PAG5-1)
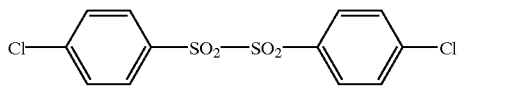

(PAG5-2)
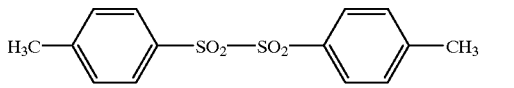

(PAG5-3)
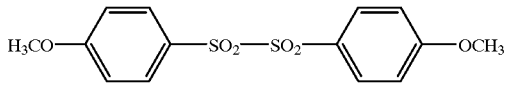

(PAG5-4)
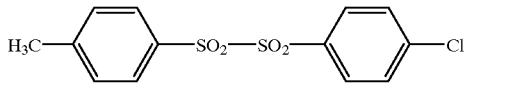

(PAG5-5)
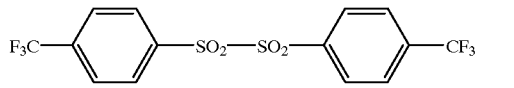

(PAG5-6)
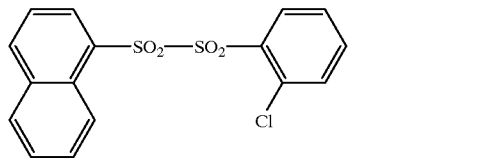

(PAG5-7)
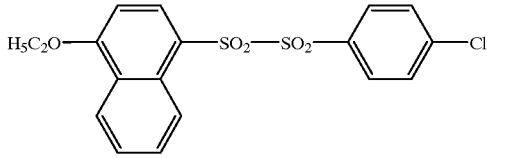

(PAG5-8)
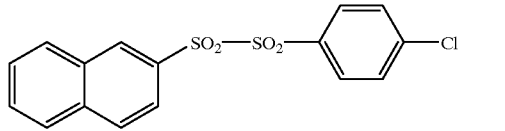

(PAG5-9)
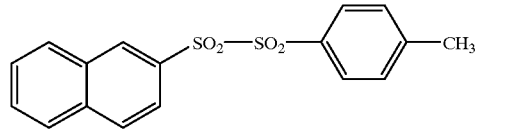

(PAG5-10)
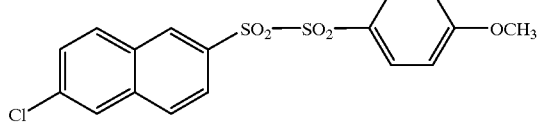

(PAG5-11)
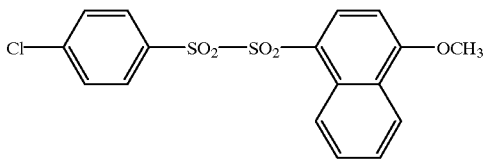

(PAG5-12)
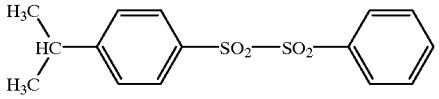

(PAG5-13)
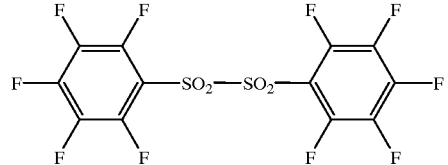

(PAG5-14)
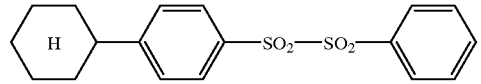

[4] Resin Having Groups Decomposing by the Action of Acid to Enhance Solubility in Alkaline Developing Solution The resin which has groups capable of decomposing by the action of an acid to enhance solubility of the resin in an alkaline developing solution, which can be incorporated in the chemically amplified resist according to the present invention, is a resin having acid-decomposable groups in the backbone and/or side chains thereof, preferably in side chains thereof.

The group capable of decomposing by the action of an acid is preferably one represented by —COOA$^0$ or —O—B$^0$. Examples of the groups containing these groups are those represented by —R$^0$—COOA$^0$ or —Ar—O—B$^0$.

A$^0$ represents —C(R$^{01}$)(R$^{02}$)(R$^{03}$), —Si(R$^{01}$)(R$^{02}$)(R$^{03}$), or —C(R$^{04}$)(R$^{05}$)—O—R$^{06}$, and B$^0$ represents —A$^0$ or —CO—O—A$^0$. (R$^0$, R$^{01}$ to R$^{06}$, and Ar have the same meanings as will be defined later.)

Desirable examples of the acid-decomposable groups include silyl ether groups, cumyl ester groups, acetal groups, tetrahydropyranyl ether groups, tetrahydropyranyl ester groups, enol ether groups, enol ester groups, tertiary alkyl ether groups, tertiary alkyl ester groups, and tertiary alkyl carbonate groups. Preferred among these acid-decomposable groups are those which are relatively highly decomposable by an acid, such as silyl ether groups, acetal groups, and tetrahydropyranyl ether groups, in particular acetal groups. This is because such readily acid-decomposable groups, when used in combination with the photo-acid generators of the present invention, are more effective in producing the effects of the present invention, i.e., high sensitivity and high resolving power, freedom from a decrease in resist pattern line width and from the formation of a T-top resist pattern surface with the lapse of time from exposure to heat treatment, and the inhibition of residual standing wave and profile deterioration such as collapse.

In the case where these acid-decomposable groups are bonded as side chains to a resin, this resin is an alkali-soluble resin having —OH or —COOH groups, preferably —R$^0$—

COOH or —Ar—OH groups, in side chains. Examples of the alkali-soluble resin will be given later.

These alkali-soluble resins have an alkali dissolution rate of desirably 170 Å/sec or higher, preferably 330 Å/sec or higher, as measured in 0.261 N tetramethylammonium hydroxide (TMAH) at 23° C.

Desirable from the standpoint of attaining a rectangular profile is an alkali-soluble resin having a high far-ultraviolet or excimer laser beam transmittance. A 1 μm-thick film of the resin preferably has a transmittance of from 20 to 90% at a wavelength of 248 nm.

Especially preferred alkali-soluble resins from the above standpoint are poly(o-, m-, or p-hydroxystyrene), copolymers thereof, hydrogenated poly(hydroxystyrene)s, halogen- or alkyl-substituted poly(hydroxystyrene)s, partially O-alkylated or O-acylated poly(hydroxystyrene)s, styrene/hydroxystyrene copolymers, α-methylstyrene/hydroxystyrene copolymers, and hydrogenated novolak resins.

The resin having acid-decomposable groups for use in the present invention can be obtained by reacting an alkali-soluble resin with a precursor for acid-decomposable groups or by copolymerizing a monomer for an alkali-soluble resin which monomer has an acid-decomposable group with any of various monomers, as disclosed in, e.g., European Patent 254,853, JP-A-2-25850, JP-A-3-223860, and JP-A-4-251259.

Specific examples of the resin having acid-decomposable groups which is used in the present invention are given below, but that resin should not be construed as being limited thereto.

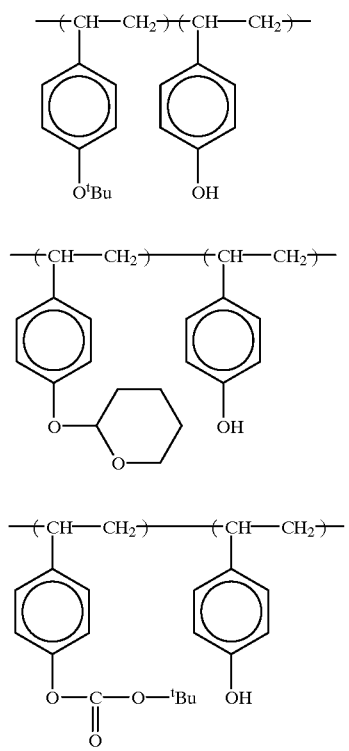

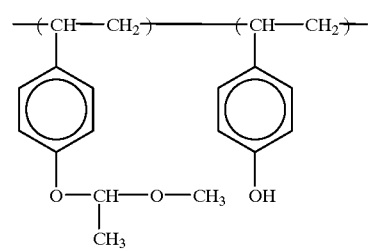

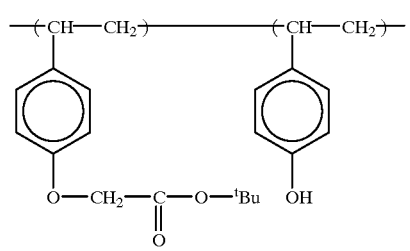

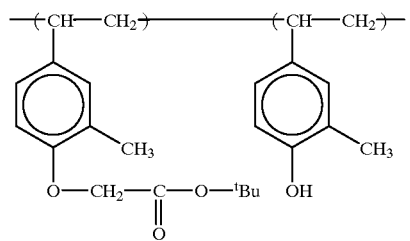

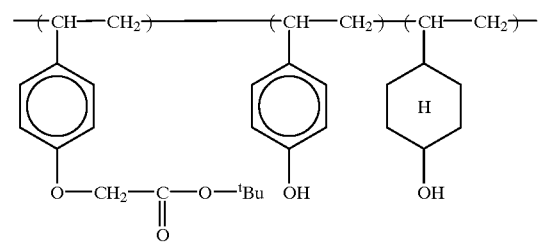

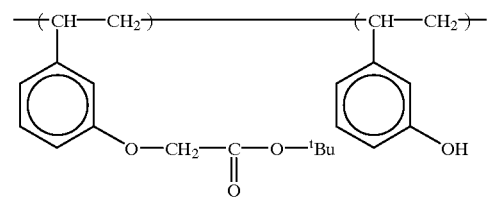

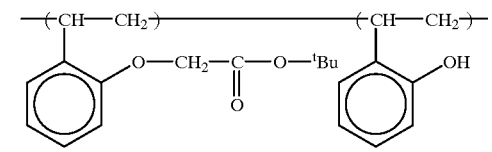

(x)
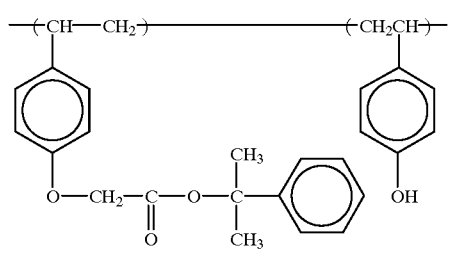
(xi)
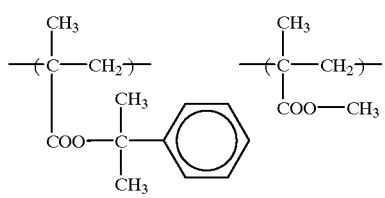
(xii)
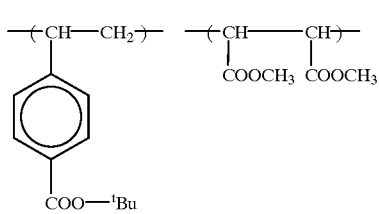
(xiii)
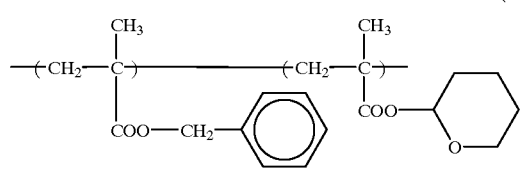
(xiv)
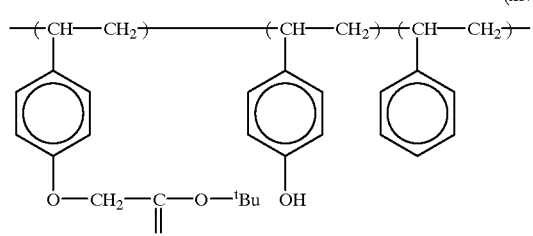
(xv)
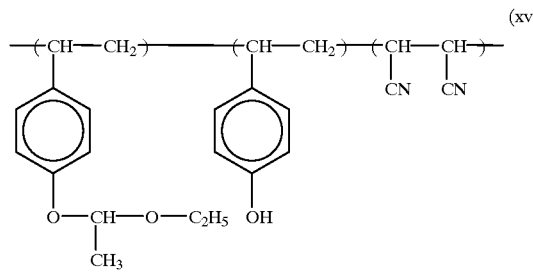
(xvi)
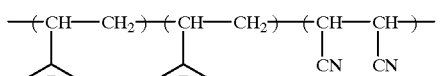
(xvii)
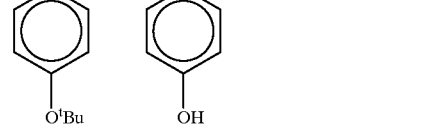
(xviii)
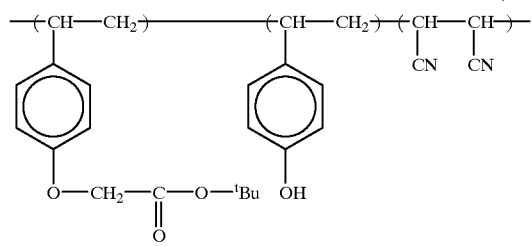
(xix)
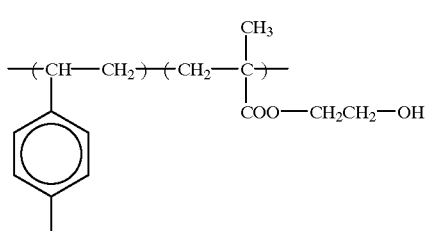
(xx)
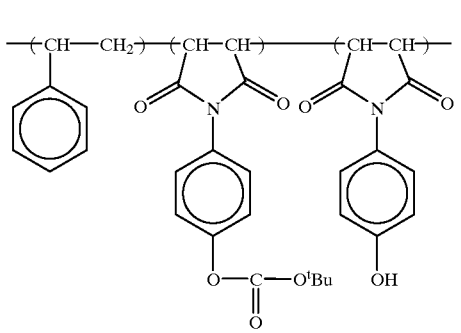
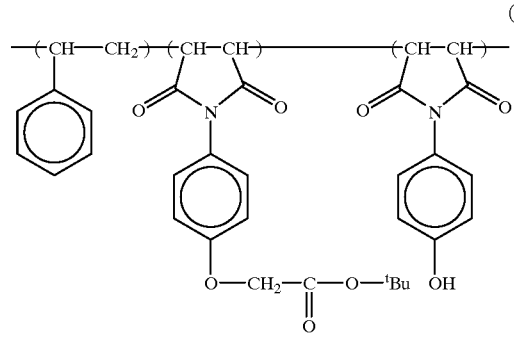

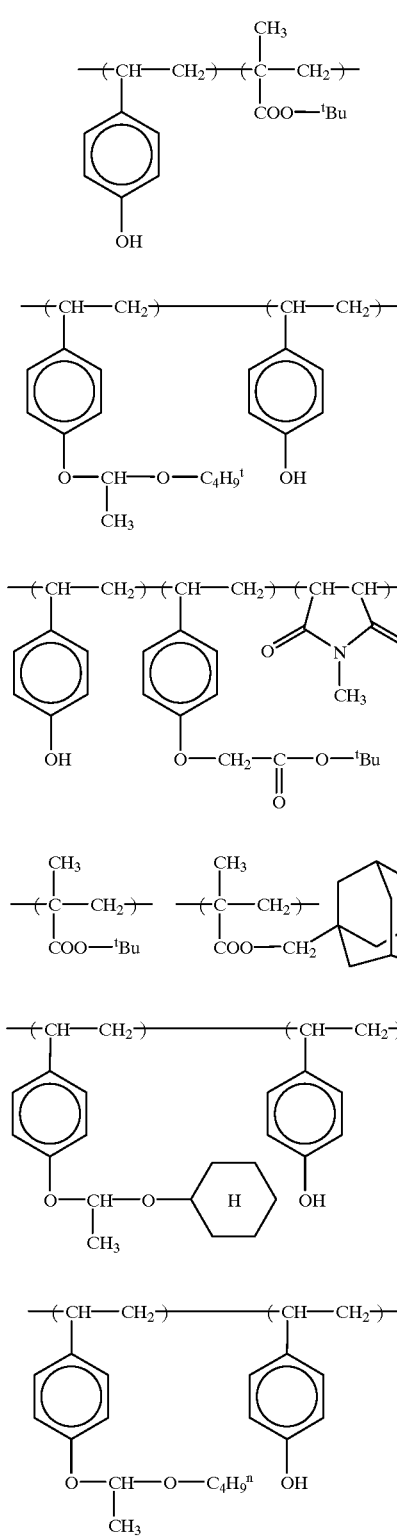

Preferred among the above-enumerated examples of the resin having groups which decompose by the action of an acid to enhance solubility in an alkaline developing solution are compounds (ii), (iv), (xiii), (xv), (xxii), (xxv), and (xxvi).

With respect to resins having acetal groups as acid-decomposable groups, among the above-enumerated resins protected with acid-decomposable groups, it is possible to incorporate crosslinks by the following method. A compound containing hydroxyl groups in the molecule is added in a small amount in protecting an existing polyhydroxystyrene with acetal groups, whereby polyhydroxystyrene chains intramolecularly or intermolecularly crosslinked through the compound containing hydroxyl groups in the molecule can be obtained. This crosslinked system is preferred from the standpoint of the heat resistance of a resist.

Although the compound which contains hydroxyl groups in the molecule and is added in order to form crosslinks is not particularly limited, aromatic compounds are undesirable because they highly absorb actinic rays or a radiation in the ultraviolet region, which is to be used for exposure. Examples of the polyhydroxy compound include 1,4-dihydroxycyclohexane, 2,2-bis(4'-hydroxycyclohexyl) propane, tri(4'-hydroxycyclohexyl)ethane, and pentaerythritol. However, the polyhydroxy compound should not be construed as being limited to these examples.

The addition amount of the compound which contains hydroxyl groups in the molecule and is used for crosslinking is preferably from 0.01 to 10% by mole, more preferably from 0.05 to 5% by mole, most preferably from 0.1 to 3% by mole, on the average based on the number of the alkali-soluble groups (e.g., phenolic hydroxyl groups or carboxyl groups) of the unprotected resin to be subjected to protection with acetal groups.

The content of groups decomposable by an acid is expressed in terms of B/(B+S), wherein B is the number of the groups decomposable by an acid (acid-decomposable groups) in the resin and S is the number of alkali-soluble groups (e.g., phenolic hydroxyl groups or carboxyl groups) not protected with acid-decomposable groups. In the non-crosslinked system, the content of acid-decomposable groups is preferably from 0.05 to 0.6, more preferably from 0.1 to 0.5, most preferably from 0.15 to 0.45. On the other hand, in a system to which a crosslinking agent has been added, the content of acid-decomposable groups is preferably from 0.03 to 0.55, more preferably from 0.08 to 0.45, most preferably from 0.12 to 0.42. Contents thereof higher than the upper limit are undesirable, for example, in that such a resin suffers film shrinkage through heat treatment after exposure (PEB), has insufficient adhesion to a substrate, and causes a scum. On the other hand, too low contents thereof are undesirable in that such a resin causes reduced resolving power, etc., resulting in troubles in image formation.

Other comonomers may be suitably added in an appropriate amount for the purpose of controlling the glass transition point of the resin and the like.

The weight-average molecular weight ($M_w$) of the resin having acid-decomposable groups is preferably from 2,000 to 200,000. If the $M_w$ thereof is lower than 2,000, a considerable proportion of unexposed parts of a resist film dissolve away during development. If the $M_w$ thereof exceeds 200,000, the alkali-soluble resin itself has too low a rate of-dissolution in an alkali, resulting in reduced sensitivity. The $M_w$ of the resin is more preferably from 5,000 to 150,000, even more preferably from 8,000 to 100,000, most preferably from 10,000 to 80,000. The molecular weight distribution ($M_w/M_n$) of the non-crosslinked system is preferably from 1.0 to 4.0, more preferably from 1.0 to 3.0, most preferably from 1.0 to 2.0. Degrees of dispersion thereof exceeding 4.0 are undesirable in that such a resin is reduced in resolving power and heat resistance. The molecular weight distribution ($M_w/M_n$) of a crosslinked system is preferably from 1.0 to 4.5, more preferably from 1.0 to 3.5, most preferably from 1.0 to 3.0. The molecular weight distribution thereof exceeding 4.5 is undesirable in that such a resin is reduced in resolving power and heat resistance. The smaller the molecular weight distribution, the better the heat resistance and image-forming properties (pattern profile, defocus latitude, etc.).

Weight-average molecular weight ($M_w$) and number-average molecular weight ($M_n$) herein mean those determined through measurement by gel permeation chromatography and calculation for standard polystyrene.

The resin having acid-decomposable groups for use in the present invention may be used as a mixture of two or more thereof. For example, use may be made of a mixture of a resin having readily acid-decomposable groups such as acetal groups and a resin having not-readily acid-decomposable groups such as tertiary alkyl ester groups. A mixture of a non-crosslinked resin and a crosslinked resin may also be used. The used amount of these resins in the present invention is preferably from 40 to 98% by weight, more preferably from 50 to 95% by weight, based on the total amount of all solid components. An alkali-soluble resin having no acid-decomposable groups may be further incorporated into the composition for the purpose of regulating alkali solubility.

An acid-decomposable low-molecular dissolution inhibitive compound which will be described later is preferably incorporated into the composition together with the acid generators and the resin having acid-decomposable groups.

In this case, the content of the dissolution inhibitive compound is from 3 to 45% by weight, preferably from 5 to 30% by weight, more preferably from 10 to 20% by weight, based on the total amount of the photosensitive composition (excluding the solvent).

[5] Alkali-soluble Resin for Use in the Invention

A resin insoluble in water and soluble in an aqueous alkali solution (hereinafter referred to also as "alkali-soluble resin") is preferably used in the present invention.

Examples of the alkali-soluble resin for use in the present invention include novolak resins, hydrogenated novolak resins, acetone-pyrogallol resins, poly(o-hydroxystyrene), poly(m-hydroxystyrene), poly(p-hydroxystyrene), hydrogenated poly(hydroxystyrene)s, halogen- or alkyl-substituted poly(hydroxystyrene)s, hydroxystyrene/N-substituted maleimide copolymers, o/p- and m/p-hydroxystyrene copolymers, partially O-alkylated poly(hydroxystyrene)s [e.g., O-methylated, O-(1-methoxy)ethylated, O-(1-ethoxy)ethylated, O-2-tetrahydropyranylated, and O-(t-butoxycarbonyl)methylated poly(hydroxystyrene)s having a degree of substitution of from 5 to 30 mol % of the hydroxyl groups], O-acylated poly(hydroxystyrene)s [e.g., O-acetylated and O-(t-butoxy)carbonylated poly(hydroxystyrene)s having a degree of substitution of from 5 to 30 mol % of the hydroxyl groups], styrene/maleic anhydride copolymers, styrene/hydroxystyrene copolymers, (α-methylstyrene/hydroxystyrene copolymers, carboxylated methacrylic resins, and derivatives thereof. However, the alkali-soluble resin for use in the present invention should not be construed as being limited to these examples.

Especially preferred alkali-soluble resins are novolak resins, poly(o-hydroxystyrene), poly(m-hydroxystyrene), poly(p-hydroxystyrene), copolymers of these hydroxystyrenes, alkyl-substituted poly(hydroxystyrene)s, partially O-alkylated or O-acylated poly(hydroxystyrene)s, styrene/hydroxystyrene copolymers, and α-methylstyrene/hydroxystyrene copolymers. The novolak resins are obtained by addition-condensing one or more given monomers as the main ingredient with one or more aldehydes in the presence of an acid catalyst.

Examples of the given monomers include hydroxylated aromatic compounds such as phenol, cresols, i.e., m-cresol, p-cresol, and o-cresol, xylenols, e.g., 2,5-xylenol, 3,5-xylenol, 3,4-xylenol, and 2,3-xylenol, alkylphenols, e.g., m-ethyethylphenol, p-ethylphenol, o-ethylphenol, p-t-butylphenol, p-octylphenol, and 2,3,5-trimethylphenol, alkoxyphenols, e.g., p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol, and p-butoxyphenol, dialkylphenols, e.g., 2-methyl-4-isopropylphenol, and other hydroxylated aromatics including m-chlorophenol, p-chlorophenol, o-chlorophenol, dihydroxybiphenyl, bisphenol A, phenylphenol, resorcinol, and naphthol. These compounds may be used alone or as a mixture of two or more thereof. The main monomers for novolak resins should not be construed as being limited to the above examples.

Examples of the aldehydes include formaldehyde, paraformaldehyde, acetaldehyde, propionaldehyde, benzaldehyde, phenylacetaldehyde, α-phenylpropionaldehyde, β-phenylpropionaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde, and acetals derived from these, such as chloroacetaldehyde diethyl acetal. Preferred of these is formaldehyde.

These aldehydes may be used alone or in combination of two or more thereof. Examples of the acid catalyst include hydrochloric acid, sulfuric acid, formic acid, acetic acid, and oxalic acid.

The weight-average molecular weight of the thus-obtained novolak resin is desirably from 1,000 to 30,000. If the weight-average molecular weight thereof is lower than 1,000, the film reduction at unexposed parts during development is liable to be large. If the weight-average molecular weight thereof exceeds 30,000, the developing rate may be too low. The especially preferred range of the molecular weight of the novolak resin is from 2,000 to 20,000.

The poly(hydroxystyrene)s and derivatives and copolymers thereof shown above as alkali-soluble resins other than novolak resins each has a weight-average molecular weight of 2,000 or higher, preferably from 5,000 to 200,000, more preferably from 10,000 to 100,000. From the standpoint of obtaining a resist film having improved heat resistance, the weight-average molecular weight thereof is desirably 25,000 or higher.

Weight-average molecular weight herein means that determined by gel permeation chromatography and calculated for standard polystyrene.

In the present invention, these alkali-soluble resins may be used as a mixture of two or more thereof. In the case where a mixture of an alkali-soluble resin and the resin having groups which decompose by the action of an acid to enhance solubility in an alkaline developing solution is used, the addition amount of the alkali-soluble resin is preferably up to 80% by weight, more preferably up to 60% by weight, most preferably up to 40% by weight, based on the total amount of the photosensitive composition (excluding the solvent). The amount exceeding 80% by weight is undesirable in that a resist pattern suffers a considerable decrease in thickness, resulting in troubles in image formation.

In the case where an alkali-soluble resin is used without the resin having groups which decompose by the action of an acid to enhance solubility in an alkaline developing solution, the added amount of the alkali-soluble resin is preferably from 40 to 90% by weight, more preferably from 50 to 85% by weight, most preferably from 60 to 80% by weight. If the amount thereof is smaller than 40% by weight, undesirable results such as reduced sensitivity are caused. On the other hand, if it exceeds 90% by weight, a resist pattern suffers a considerable decrease in film thickness, resulting in troubles in image formation.

[6] Low-molecular Acid-decomposable Dissolution Inhibitive Compound for Use in the Invention A low-molecular acid-decomposable dissolution inhibitive compound is preferably used in the present invention.

The acid-decomposable dissolution inhibitive compound for use in the present invention is a compound which has at least two acid-decomposable groups in the molecular structure and in which the two acid-decomposable groups most apart from each other are separated by at least 8 bonding atoms.

In the present invention, the acid-decomposable dissolution inhibitive compound is desirably either a compound which has at least two acid-decomposable groups in the molecular structure and in which the two acid-decomposable groups most apart from each other are separated by at least 10, preferably at least 11, more preferably at least 12 bonding atoms, or a compound which has at least three acid-decomposable groups and in which the two acid-decomposable groups most apart from each other are separated by at least 9, preferably at least 10, more preferably at least 11 bonding atoms. The upper limit of the bonding atoms by which the two acid-decomposable groups most apart from each other are separated is preferably 50, more preferably 30.

In the case where the acid-decomposable dissolution inhibitive compound has three or more, desirably four or more acid-decomposable groups, the compound exhibits an extremely improved dissolution inhibiting effect on the alkali-soluble resin when the acid-decomposable groups are apart from each other at least at a given distance. This is true also in the case where the acid-decomposable dissolution inhibitive compound has two acid-decomposable groups.

The distance between acid-decomposable groups in the present invention is expressed in terms of the number of bonding atoms present between the groups, excluding the atoms contained in the groups. For example, in each of compounds (1) and (2) shown below, the distance between acid-decomposable groups is 4 bonding atoms. In compound (3), that distance is 12 bonding atoms.

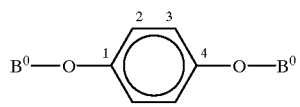

(1)

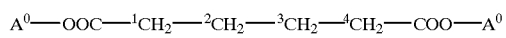

(2)

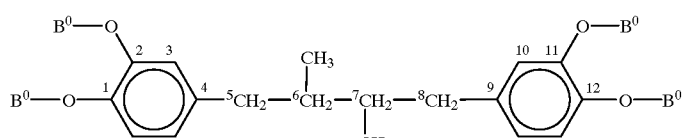

(3)

Although the acid-decomposable dissolution inhibitive compound for use in the present invention may have two or more acid-decomposable groups on the same benzene ring, it is preferably a compound having a framework in which each benzene ring does not have more than one acid-decomposable group. The molecular weight of the acid-decomposable dissolution inhibitive compound for use in the present invention is 3,000 or lower, preferably from 500 to 3,000, more preferably from 1,000 to 2,500.

In a preferred embodiment of the present invention, examples of groups containing an acid-decomposable group, i.e., —COO—$A^0$ or —O—$B^0$, include groups represented by —$R^0$—COO—$A^0$ or —Ar—O—$B^0$.

In the above formulae, $A^0$ represents —$C(R^{01})(R^{02})(R^{03})$, —$Si(R^{01})(R^{02})(R^{03})$, or —$C(R^{04})(R^{05})$—O—$R^{06}$, and $B^0$ represents $A^0$ or —CO—O—$A^0$.

$R^{01}$, $R^{02}$, $R^{03}$, $R^{04}$, and $R^{05}$ may be the same or different and each represents a hydrogen atom, an alkyl group, a cycloalkyl group, an alkenyl group, or an aryl group, and $R^{06}$ represents an alkyl group or an aryl group, provided that at least two of $R^{01}$ to $R^{03}$ are not hydrogen atoms, and that two of $R^{01}$ to $R^{03}$ or two of $R^{04}$ to $R^{06}$ may be bonded to each other to form a ring. $R^0$ represents an optionally substituted, aliphatic or aromatic hydrocarbon group having a valence of 2 or higher, and —Ar— represents an optionally substituted, mono- or polycyclic aromatic group having a valence of 2 or higher.

The alkyl group is preferably one having 1 to 4 carbon atoms, such as methyl, ethyl, propyl, n-butyl, sec-butyl, or t-butyl. The cycloalkyl group is preferably one having 3 to 10 carbon atoms, such as cyclopropyl, cyclobutyl, cyclohexyl, or adamantyl. The alkenyl group is preferably one having 2 to 4 carbon atoms, such as vinyl, propenyl, allyl, or butenyl. The aryl group is preferably one having 6 to 14 carbon atoms, such as phenyl, xylyl, toluyl, cumenyl, naphthyl, or anthracenyl.

Examples of the substituents include hydroxy, halogen atoms (fluorine, chlorine, bromine, and iodine), nitro, cyano, the alkyl groups enumerated above, alkoxy groups such as methoxy, ethoxy, hydroxyethoxy, propoxy, hydroxypropoxy, n-butoxy, isobutoxy, sec-butoxy, and t-butoxy, alkoxycarbonyl groups such as methoxycarbonyl and ethoxycarbonyl, aralkyl groups such as benzyl, phenethyl, and cumyl, aralkyloxy groups, acyl groups such as formyl, acetyl, butyryl, benzoyl, cyanamyl, and valeryl, acyloxy groups such as butyryloxy, the alkenyl groups enumerated above, alkenyloxy groups such as vinyloxy, propenyloxy, allyloxy, and butenyloxy, the aryl groups enumerated above, aryloxy groups such as phenoxy, and aryloxycarbonyl groups such as benzoyloxy.

Desirable examples of the acid-decomposable groups include silyl ether groups, cumyl ester groups, acetal groups, tetrahydropyranyl ether groups, enol ether groups, enol ester groups, tertiary alkyl ether groups, tertiary alkyl ester groups, and tertiary alkyl carbonate groups. Preferred of these are tertiary alkyl ester groups, tertiary alkyl carbonate groups, cumyl ester groups, tetrahydropyranyl ether groups, and acetal groups.

Desirable acid-decomposable dissolution inhibitive compounds include compounds obtained from the polyhydroxy compounds given in the patent documents specified below by protecting part or all of the phenolic OH groups by bonding thereto protective groups shown above, i.e., groups represented by —$R^0$—COO—$A^0$ or $B^0$; the patent documents include JP-A-1-289946, JP-A-1-289947, JP-A-2-2560, JP-A-3-128959, JP-A-3-158855, JP-A-3-179353, JP-A-3-191351, JP-A-3-200251, JP-A-3-200252, JP-A-3-200253, JP-A-3-200254, JP-A-3-200255, JP-A-3-259149, JP-A-3-279958, JP-A-3-279959, JP-A-4-1650, JP-A-4-1651, JP-A-4-11260, JP-A-4-12356, JP-A-4-12357, and Japanese Patent Applications Nos. 3-33229, 3-230790, 3-320438, 4-25157, 4-52732, 4-103215, 4-104542, 4-107885, 4-107889, and 4-152195.

Preferred of these are the compounds obtained from the polyhydroxy compounds given in JP-A-1-289946, JP-A-3-128959, JP-A-3-158855, JP-A-3-179353, JP-A-3-200251, JP-A-3-200252, JP-A-3-200255, JP-A-3-259149, JP-A-3-279958, JP-A-4-1650, JP-A-4-11260, JP-A-4-12356, JP-A-4-12357, Japanese Patent Applications Nos. 4-25157, 4-103215, 4-104542, 4-107885, 4-107889, and 4-152195.

Specifically, such acid-decomposable dissolution inhibitive compounds are represented by general formulae (I) to (XVI).

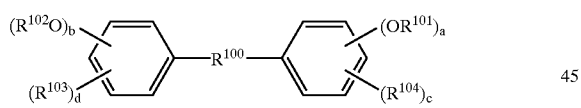

[I]

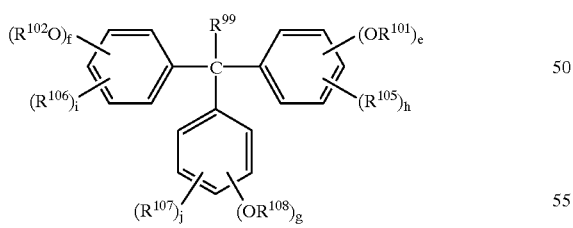

[II]

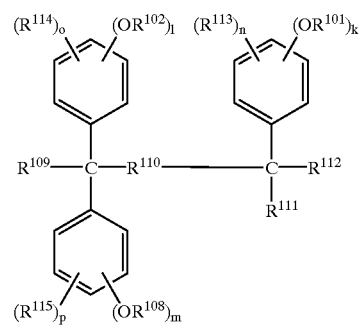

[III]

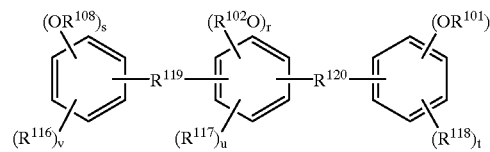

[IV]

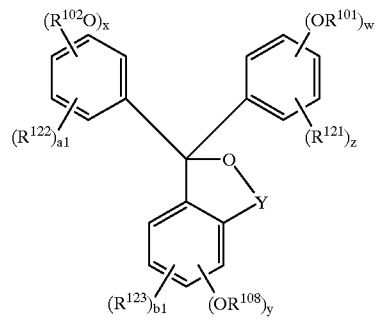

[V]

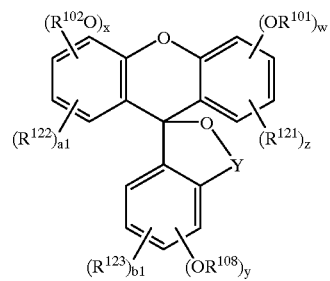

[VI]

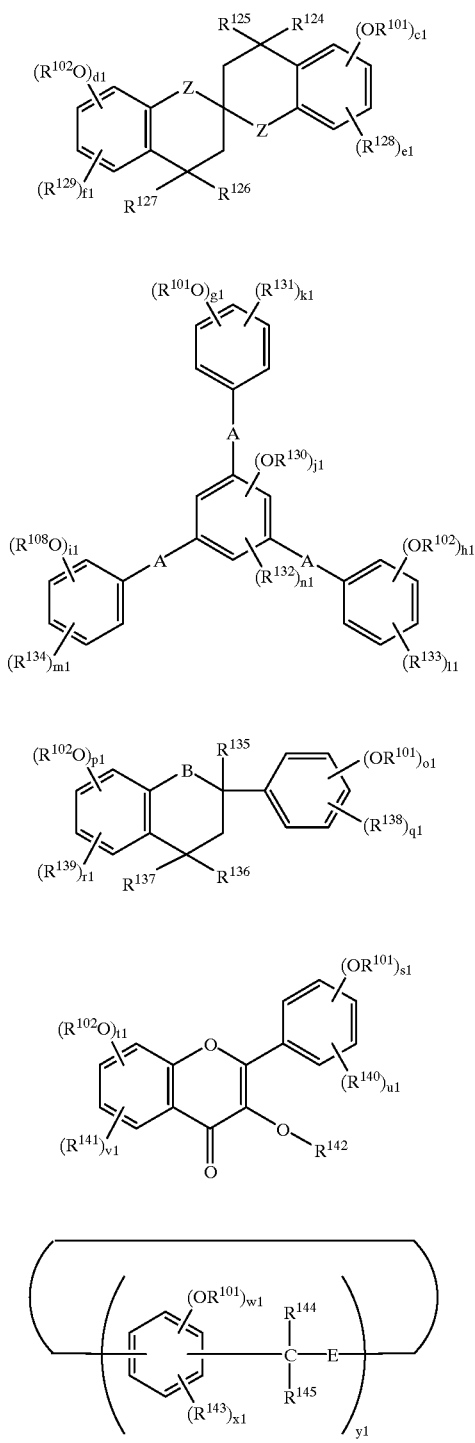

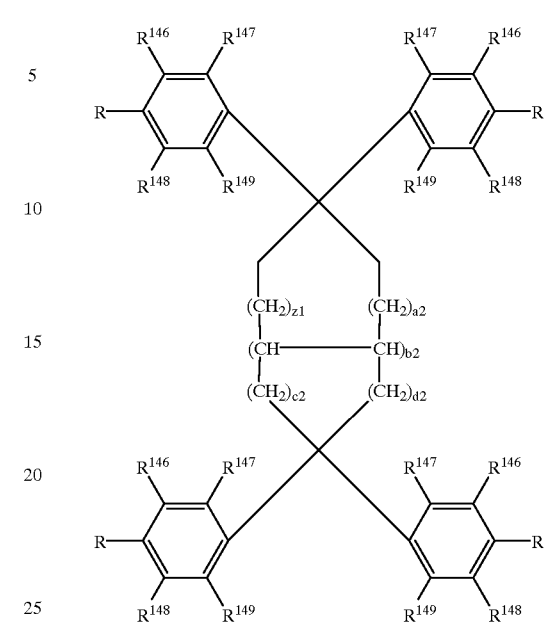

In the above formulae, $R^{101}$, $R^{102}$, $R^{108}{}_1$ and $R^{130}$ may be the same or different and each represents a hydrogen atom, —$R^0$—COO—C($R^{01}$)($R^{02}$)($R^{03}$), or —CO—O—C($R^{01}$)($R^{02}$)($R^{03}$), wherein $R^0$, $R^{01}$, $R^{02}$, and $R^{03}$ have the same meanings as defined hereinabove;

$R^{100}$ represents —CO—, —COO—, —NHCONH—, —NHCOO—, —O—, —S—, —SO—, —SO$_2$—, —SO$_3$13 , or a group represented by

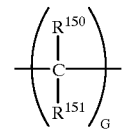

where

G is 2 to 6, provided that when G is 2, at least either of $R^{150}$ and $R^{151}$ is an alkyl group, $R^{150}$ and $R^{151}$ may be the same or different and each represents a hydrogen atom, an alkyl group, an alkoxy group, —OH, —COOH, —CN, a halogen atom, —$R^{152}$—COO$R^{153}$, or —$R^{154}$—OH, $R^{152}$ and $R^{154}$ each represents an alkylene group, and $R^{153}$ represents a hydrogen atom, an alkyl group, an aryl group, or an aralkyl group;

$R^{99}$, $R^{103}$ to $R^{107,}$ $R^{109}$, $R^{111}$ to $R^{118}$, $R^{121}$ to $R^{123}$, $R^{128}$ to $R^{129}$, $R^{131}$ to $R^{134}$, $R^{138}$ to $R^{141}$, and $R^{143}$ may be the same or different and each represents a hydrogen atom, a hydroxyl group, an alkyl group, an alkoxy group, an acyl group, an acyloxy group, an aryl group, an aryloxy group, an aralkyl group, an aralkyloxy group, a halogen atom, a nitro group, a carboxyl group, a cyano group, or —N($R^{155}$)($R^{156}$)(where $R^{155}$ and $R^{156}$ each represents H, an alkyl group, or an aryl group);

$R^{110}$ represents a single bond, an alkylene group, or a group represented by

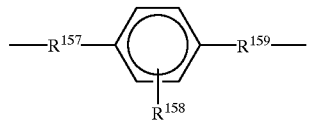

where $R^{157}$ and $R^{159}$ may be the same or different and each represents a single bond, an alkylene group, —O—, —S—, —CO—, or a carboxyl group, and $R^{158}$ represents a hydrogen atom, an alkyl group, an alkoxy group, an acyl group, an acyloxy group, an aryl group, a nitro group, a hydroxyl group, a cyano group, or a carboxyl group, provided that each hydroxyl group may be replaced by an acid-decomposable group (e.g., t-butoxycarbonylmethyl, tetrahydropyranyl, 1-ethoxy-1-ethyl, or 1-t-butoxy-1-ethyl);

$R^{119}$ and $R^{120}$ may be the same or different and each represents a methylene group, a lower-alkyl-substituted methylene group, a halomethylene group, or a haloalkyl group, provided that the term "lower alkyl" herein means an alkyl group having 1 to 4 carbon atoms;

$R^{124}$ to $R^{127}$ may be the same or different and each represents a hydrogen atom or an alkyl group;

$R^{135}$ to $R^{137}$ may be the same or different and each represents a hydrogen atom, an alkyl group, an alkoxy group, an acyl group, or an acyloxy group;

$R^{142}$ represents a hydrogen atom, —$R^{0}$—COO—C($R^{01}$)($R^{02}$)($R^{03}$), —CO—O—C($R^{01}$)($R^{02}$)($R^{03}$), or the group represented by

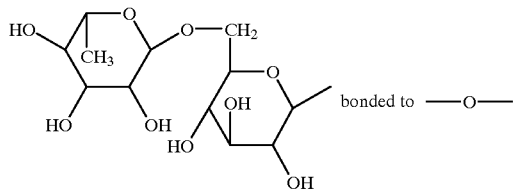

$R^{144}$ and $R^{145}$ may be the same or different and each represents a hydrogen atom, a lower alkyl group, a lower haloalkyl group, or an aryl group;

$R^{146}$ to $R^{149}$ may be the same or different and each represents a hydrogen atom, a hydroxyl group, a halogen atom, a nitro group, a cyano group, a carbonyl group, an alkyl group, an alkoxy group, an alkoxycarbonyl group, an aralkyl group, an aralkyloxy group, an acyl group, an acyloxy group, an alkenyl group, an alkenyloxy group, an aryl group, an aryloxy group, or an aryloxycarbonyl group, provided that the four groups represented by the same symbol need not be the same;

Y represents —CO— or —$SO_2$—;

Z and B each represents a single bond or —O—;

A represents a methylene group, a lower-alkyl-substituted methylene group, a halomethylene group, or a haloalkyl group;

E represents a single bond or an oxymethylene group;

when any of a to z and a1 to y1 is 2 or a larger integer, the groups in the parentheses may be the same or different;

a to q, s, t, v, g1 to i1, k1 to m1, o1, q1, s1, and u1 each represents 0 or an integer of 1 to 5;

r, u, w, x, y, z, a1 to f1, p1, r1, t1, and v1 to x1 each represents 0 or an integer of 1 to 4;

j1, n1, z1, a2, b2, c2, and d2 each represents 0 or an integer of 1 to 3;

at least one of z1, a2, c2, and d2 is 1 or larger;

y1 is an integer of 3 to 8;

(a+b), (e+f+g), (k+l+m), (q+r+s), (w+x+y), (c1+d1), (g1+h1+i1+j1), (o1+p1), and (s1+t1) each is 2 or larger;

(j1+n1) is 3 or smaller;

(r+u), (w+z), (x+a1), (y+b1), (c1+e1), (d1+f1), (p1+r1), (t1+v1), and (x1+w1) each is 4 or smaller, provided that in general formula (V), (w+z) and (x+a1) each is 5 or smaller; and (a+c), (b+d), (e+h), (f+i), (g+j), (k+n), (l+o), (m+p), (q+t), (s+v), (g1+k1), (h1+l1), (i1+m1), (o1+q1), and (s1+u1) each is 5 or smaller.

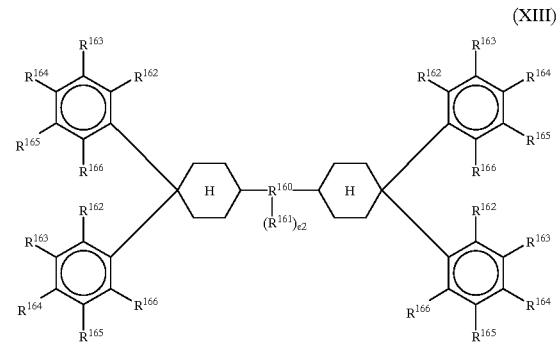

(XIII)

In formula (XIII), $R^{160}$ represents an organic group, a single bond, —S—, —SO—, or 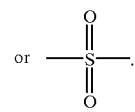

$R^{161}$ represents a hydrogen atom, a monovalent organic group, or a group represented by

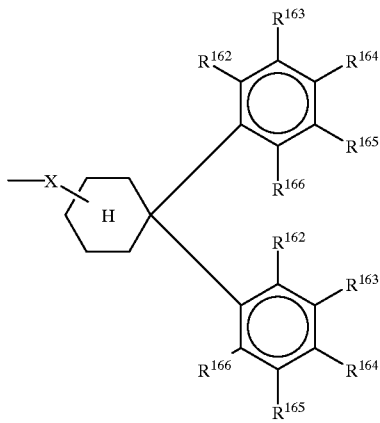

where
R$^{162}$ to R$^{166}$ may be the same or different and each represents a hydrogen atom, a hydroxyl group, a halogen atom, an alkyl group, an alkoxy group, an alkenyl group, —O—R$^0$—COO—C(R$^{01}$)(R$^{02}$)(R$^{03}$), or —O—CO—O—C(R$^{01}$)(R$^{02}$)(R$^{03}$), provided that at least two of R$^{162}$ to R$^{166}$ are —O—R$^0$—COO—C(R$^{01}$)(R$^{02}$)(R$^{03}$) or —O—CO—O—C(R$^{01}$)(R$^{02}$)(R$^{03}$), and that the four or six substituents represented by the same symbol need not be the same, and
X represents a divalent organic group; and e2 represents 0 or 1.

In formula (XIV),

R$^{167}$ to R$^{170}$ may be the same or different and each represents a hydrogen atom, a hydroxyl group, a halogen atom, an alkyl group, an alkoxy group, or an alkenyl group, provided that the four to six substituents represented by the same symbol need not be the same;

R$^{171}$ and R$^{172}$ each represents a hydrogen atom, an alkyl group, or a group represented by

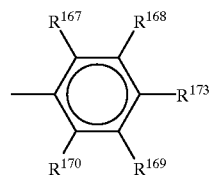

at least two of R$^{173}$'s each represents —O—R$^0$—COO—C(R$^{01}$)(R$^{02}$)(R$^{03}$) or —O—CO—O—C(R$^{01}$)(R$^{02}$)(R$^{03}$), and the remainder each represents a hydroxyl group;

f2 and h2 each represents 0 or 1; and

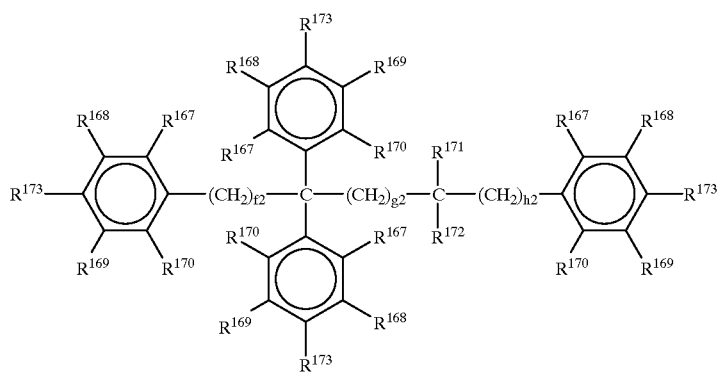

(XIV)

g2 represents 0 or an integer of 1 to 4.

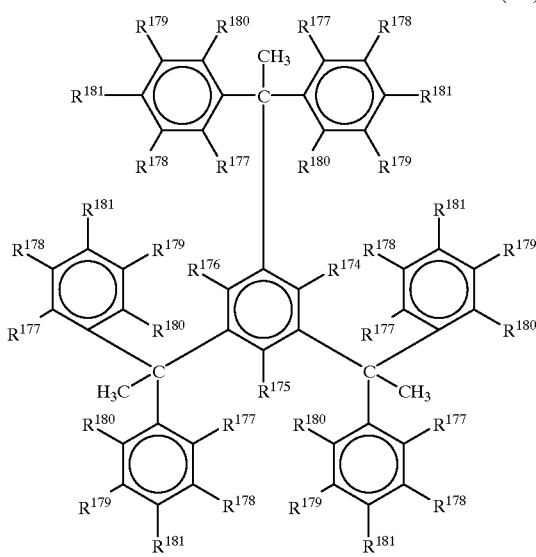

In formula (XV),

R$^{174}$ to R$^{180}$ may be the same or different and each represents a hydrogen atom, a hydroxyl group, a halogen atom, an alkyl group, an alkoxy group, a nitro group, an alkenyl group, an aryl group, an aralkyl group, an alkoxycarbonyl group, an arylcarbonyl group, an acyloxy group, an acyl group, an aralkyloxy group, or an aryloxy group, provided that the six substituents represented by the same symbol need not be the same; and at least two of R$^{181}$'s each represents —O—R$^0$—COO—C(R$^{01}$)(R$^{02}$)(R$^{03}$) or —O—CO—O—C(R$^{01}$)(R$^{02}$)(R$^{03}$), and the remainder each represents a hydroxyl group.

In formula (XVI),

R$^{182}$ represents a hydrogen atom or an alkyl group, provided that the atoms or groups represented by R$^{182}$ need not be the same;

R$^{183}$ to R$^{186}$ each represents a hydroxyl group, a hydrogen atom, a halogen atom, an alkyl group, or an alkoxy group, provided that the three substituents represented by the same symbol need not be the same; and at least two of R$^{187}$'s each represents —O—R$^0$—COO—C(R$^{01}$)(R$^{02}$)(R$^{03}$) or —O—CO—O—C(R$^{01}$)(R$^{02}$)(R$^{03}$), and the remainder each represents a hydroxyl group.

Specific examples of the frameworks of preferred compounds are shown below.

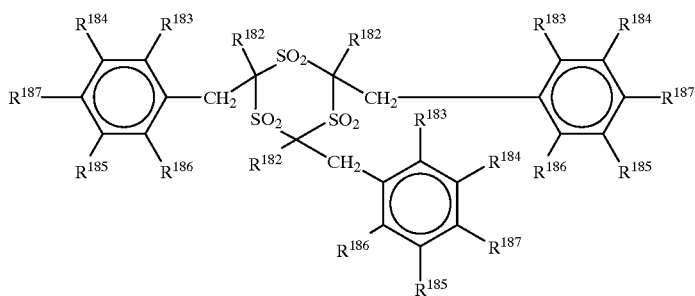

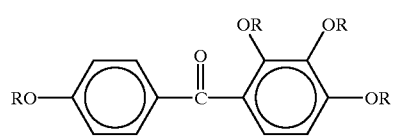
(1)
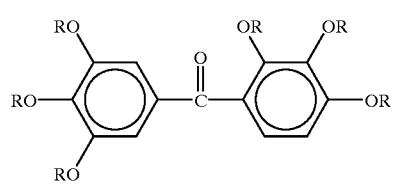
(2)
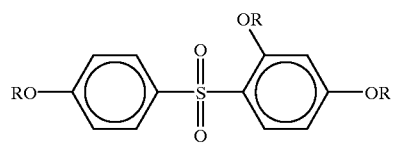
(3)
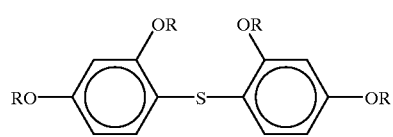
(4)
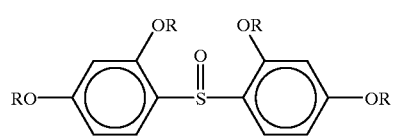
(5)
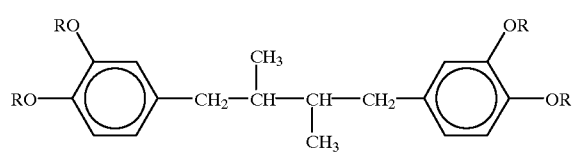
(6)
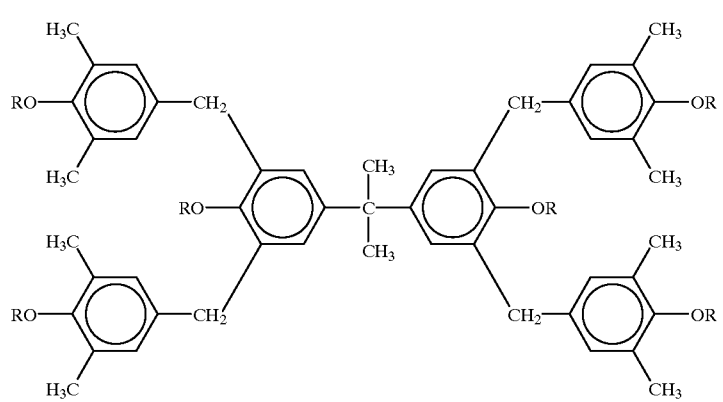
(7)
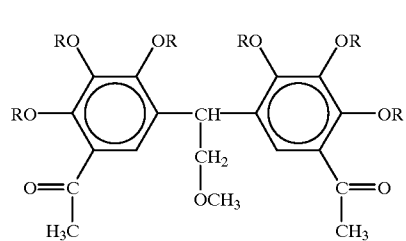
(8)

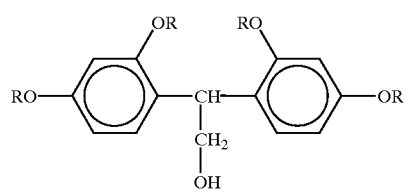
(9)
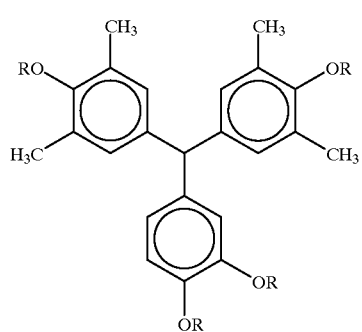
(10)
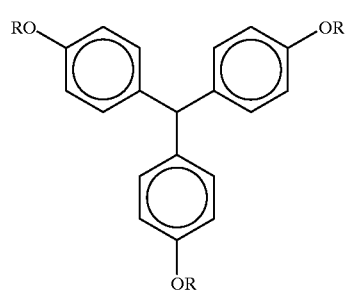
(11)
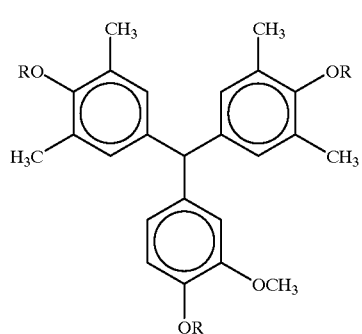
(12)
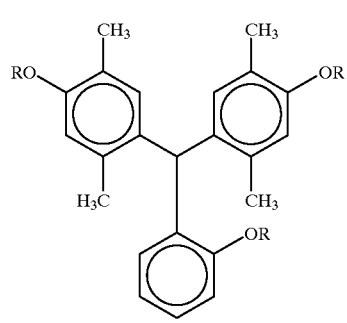
(13)

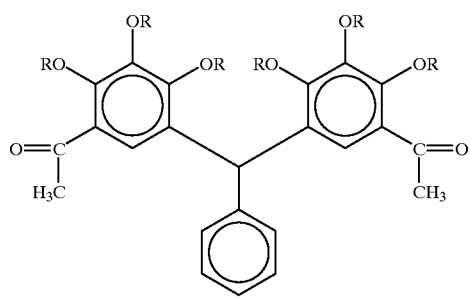
(14)
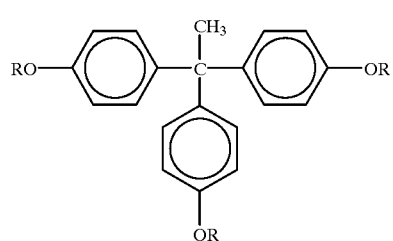
(15)
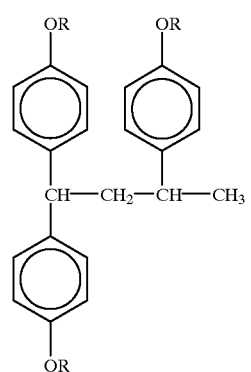
(16)
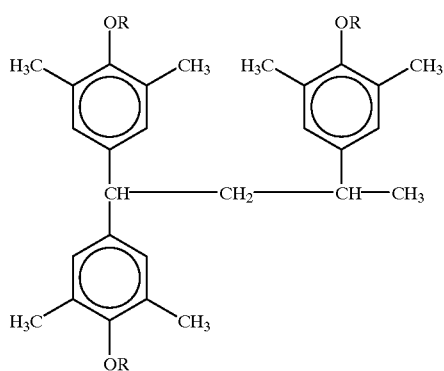
(17)

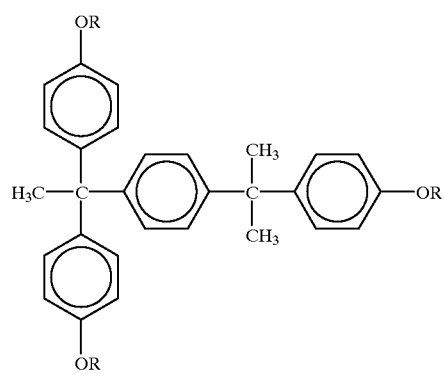
(18)
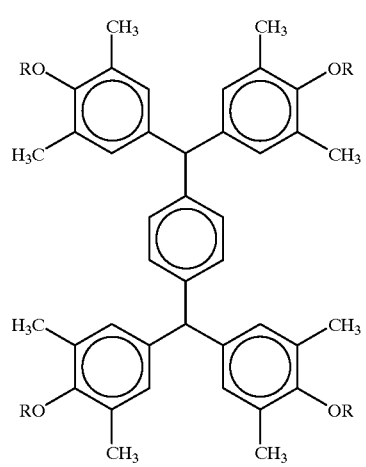
(19)
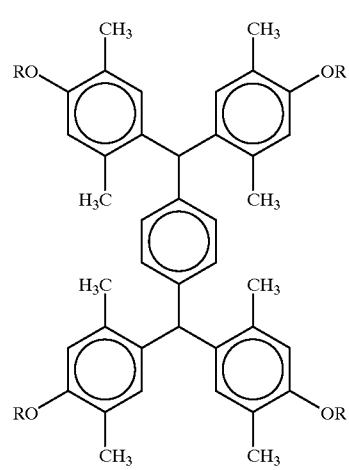
(20)

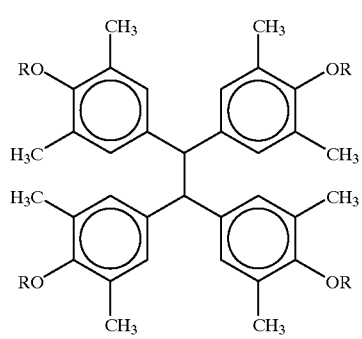
(21)
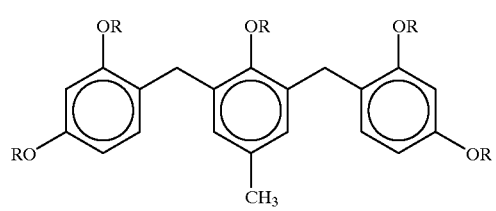
(22)
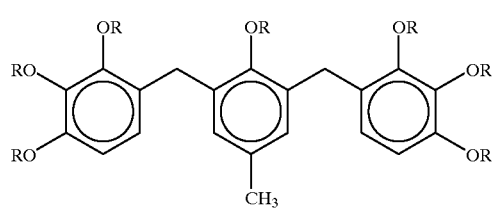
(23)
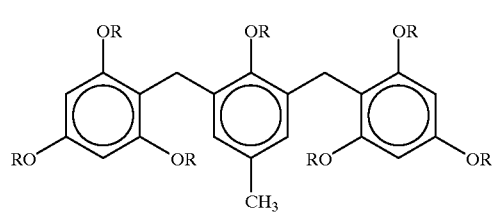
(24)
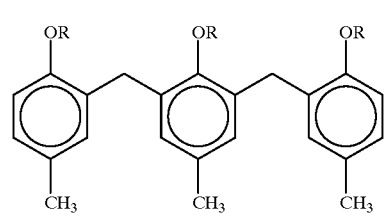
(25)
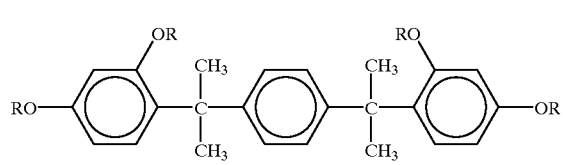
(26)
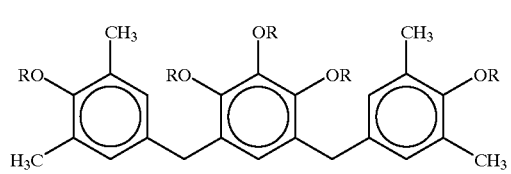
(27)

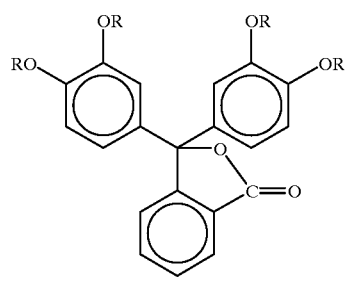
(28)
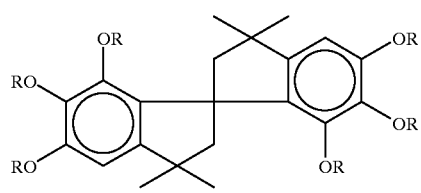
(29)
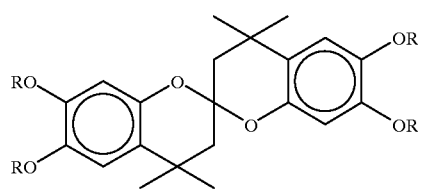
(30)
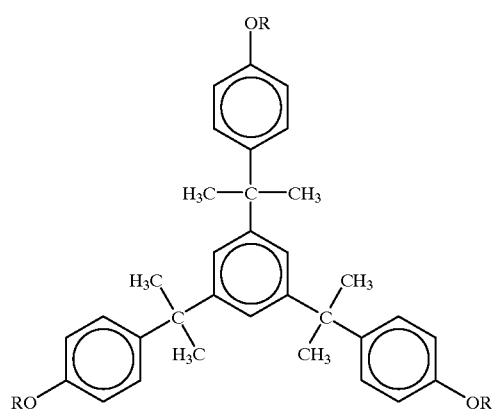
(31)
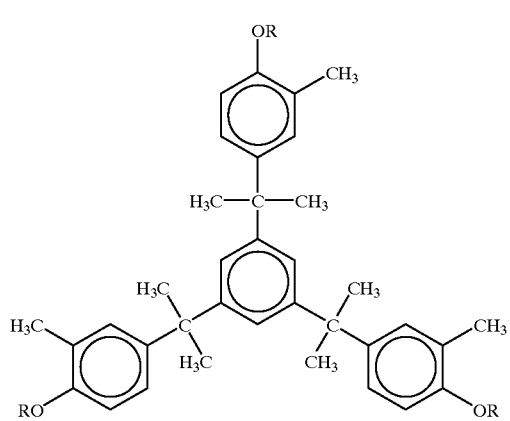
(32)

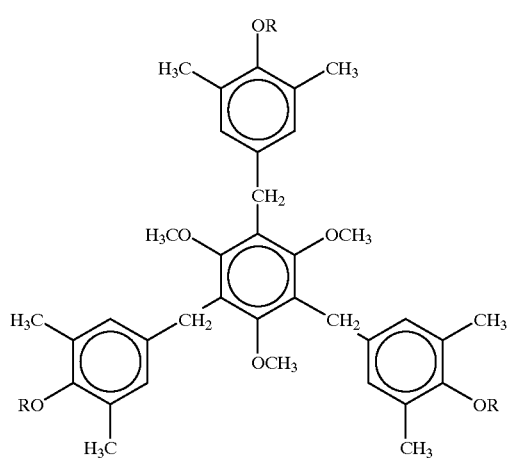
(33)
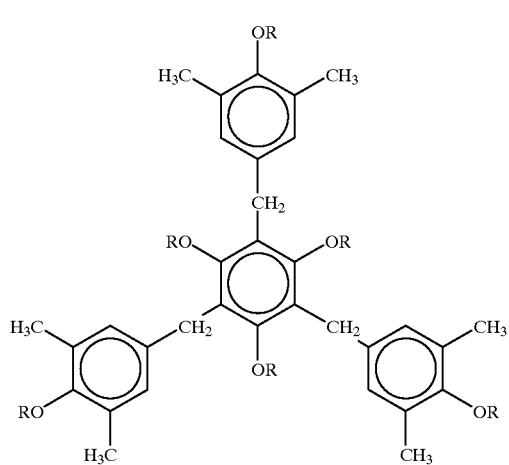
(34)
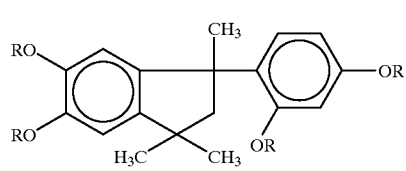
(35)
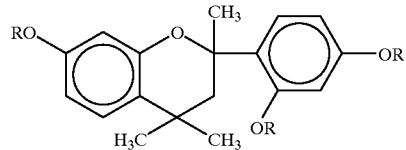
(36)
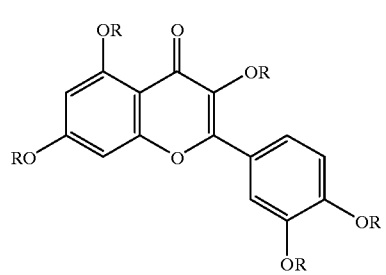
(37)

(38)
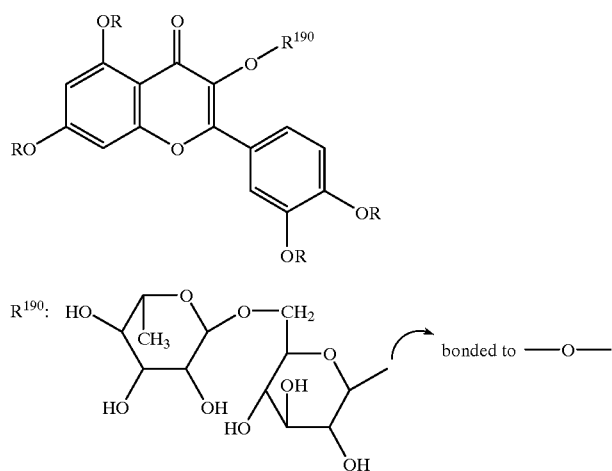
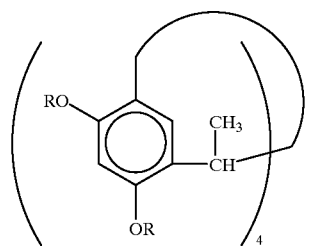
(39)
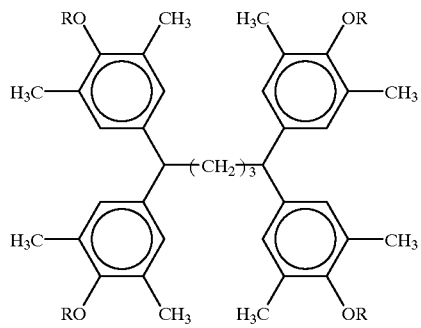
(40)
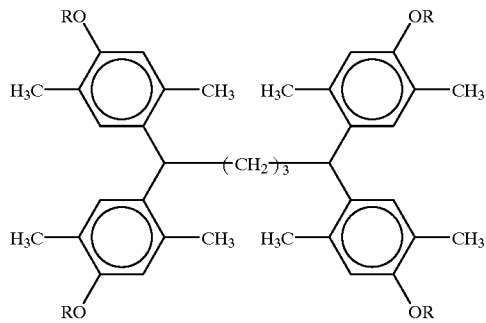
(41)

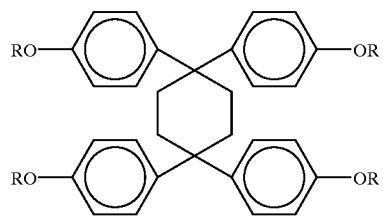
(42)
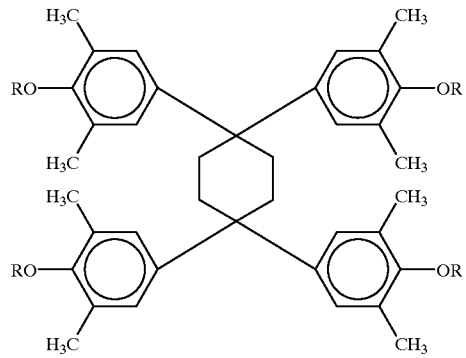
(43)
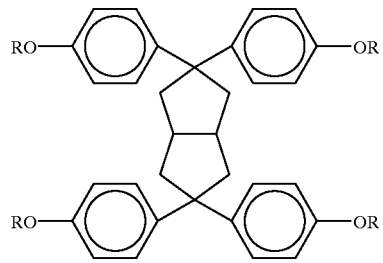
(44)
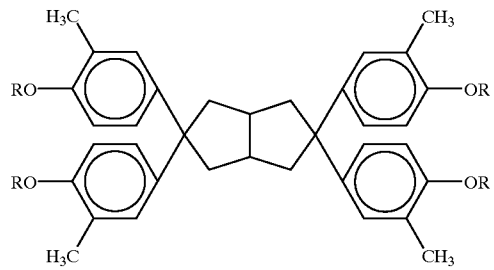
(45)
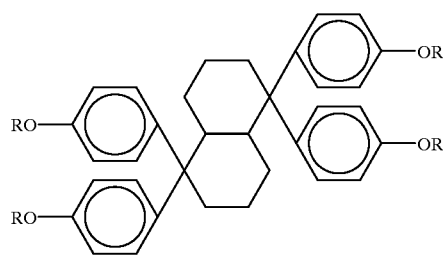
(46)

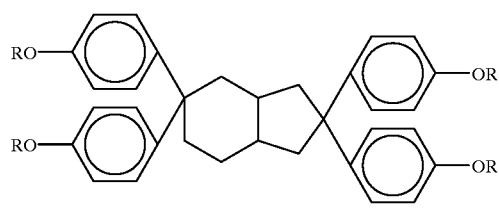
(47)
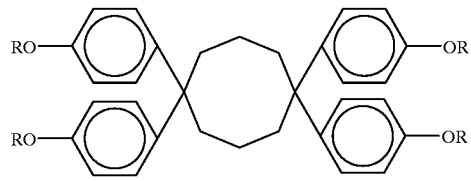
(48)
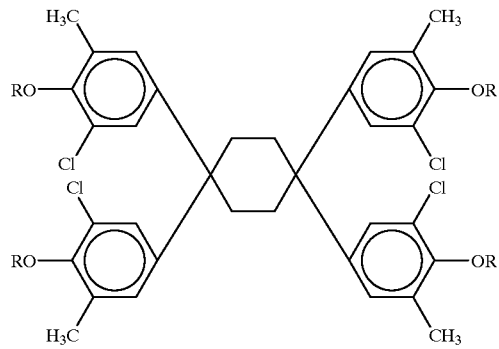
(49)
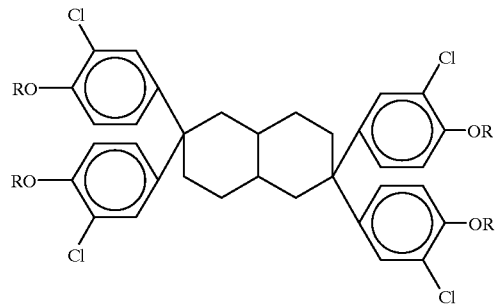
(50)
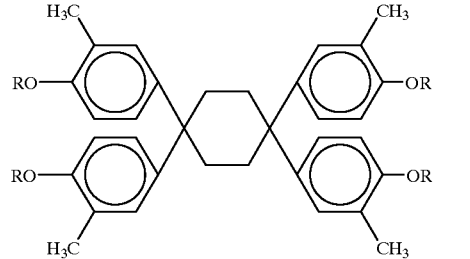
(51)

-continued
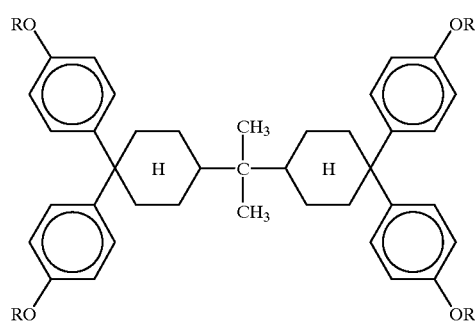
(52)
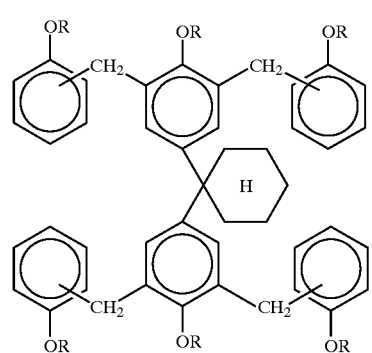
(53)
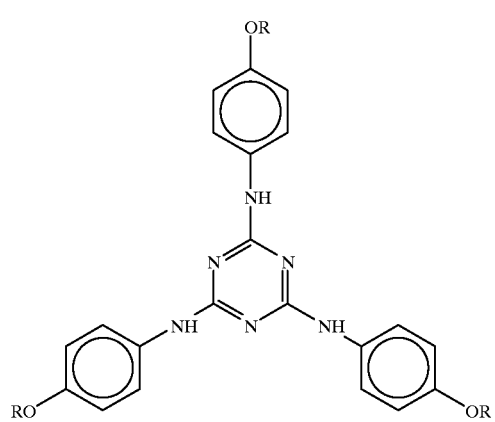
(54)
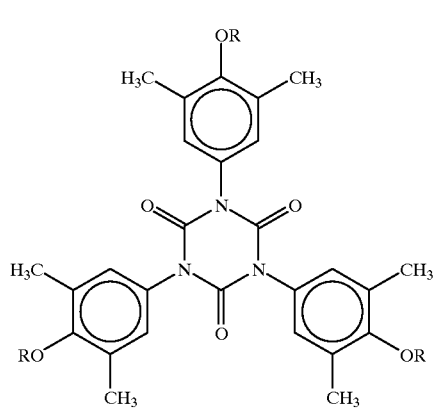
(55)

-continued
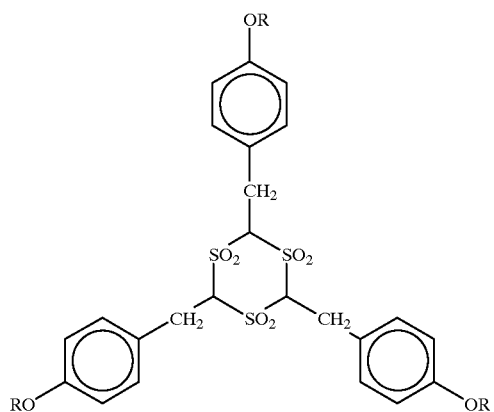
(56)
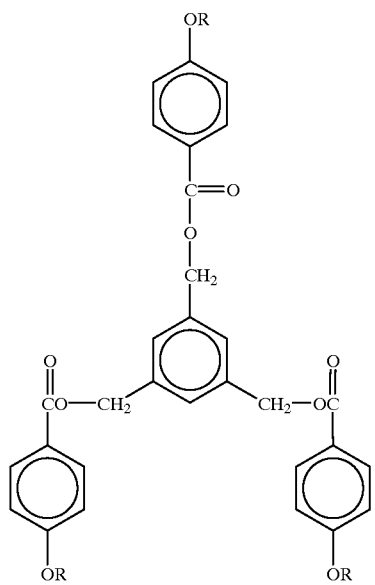
(57)
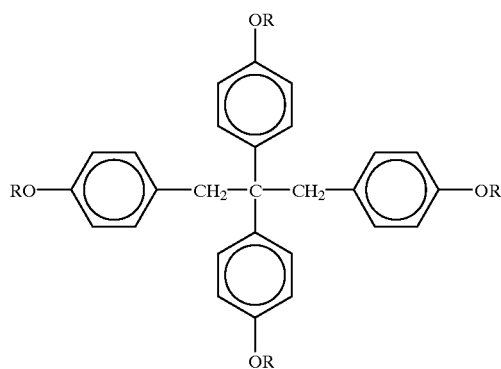
(58)

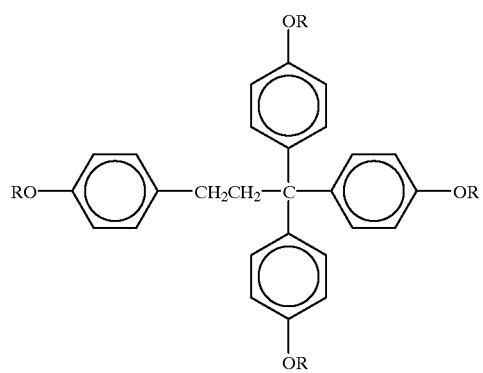
(59)
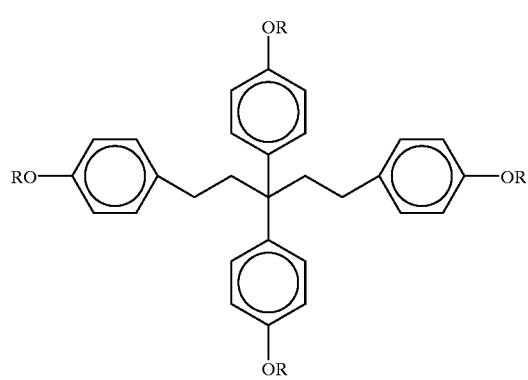
(60)
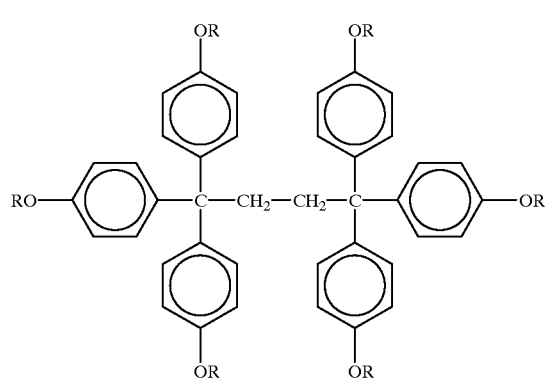
(61)
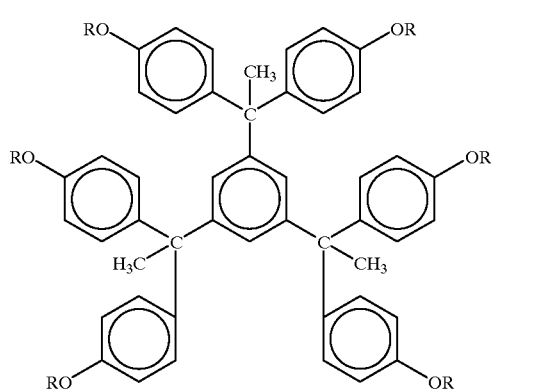
(62)

(63)

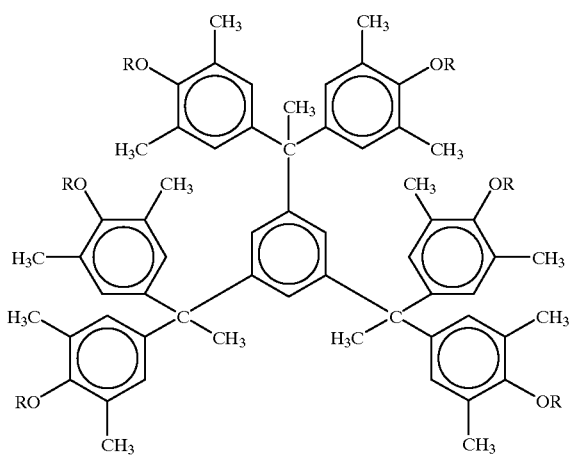

In Compounds (1) to (63), R represents a hydrogen atom,

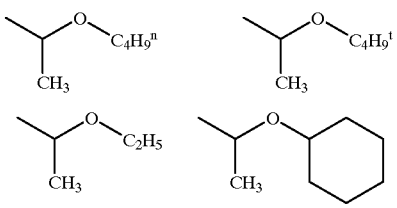

—CH$_2$—COO—C(CH$_3$)$_2$C$_6$H$_5$,  —CH$_2$—COO—C$_4$H$_9{}^t$, —COO—C$_4$H$_9{}^t$, or the group represented by

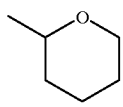

provided that at least two or, depending on the structure, at least three of R's are not hydrogen atoms, and that the substituents represented by R need not be the same.

In the case where the dissolution inhibitive compound described above is used in the present invention in combination with the acid generator compounds and the alkali-soluble resin, the addition amount of the dissolution inhibitive compound is from 5 to 55% by weight, preferably from 8 to 45% by weight, more preferably from 10 to 35% by weight, based on the total amount of all solid components of the photosensitive composition.

[7] Low-molecular Compound Insoluble in Water and Soluble in Aqueous Alkali Solution A low-molecular compound insoluble in water and soluble in an aqueous alkali solution is preferably added in the present invention for the purposes of improving sensitivity, preventing a resist pattern from suffering a decrease in line width or coming to have a T-top surface with the lapse of time from exposure to heat treatment, and inhibiting residual standing wave and profile deterioration such as collapse.

The addition amount of this low-molecular compound insoluble in water and soluble in an aqueous alkali solution is preferably from 1 to 40% by weight, more preferably from 2 to 30% by weight, most preferably from 3 to 20% by weight, based on the total amount of all resin ingredients. The amount exceeding 40% by weight is undesirable in that a resist pattern suffers a considerable decrease in film thickness, resulting in troubles in image formation.

Preferred low-molecular compounds insoluble in water and soluble in an alkali are those having, per molecule, up to 60 carbon atoms and from 2 to 8 phenolic hydroxyl groups.

Also preferred low-molecular compounds insoluble in water and soluble in an alkali are those in each of which the ratio of phenolic hydroxyl groups to aromatic rings is from 0.5 to 1.4 and which each has, per molecule, 12 to 60 carbon atoms and 2 to 10 phenolic hydroxyl groups. These low-molecular compounds may be used alone or in combination of two or more thereof. Especially preferred of these compounds are those which, when added to the water-insoluble alkali-soluble resin, heighten the alkali dissolution rate of the resin. Use of one or more of these low-molecular compounds enhances the effects of the present invention.

If the 1low-molecular compound has more than 60 carbon atoms, the effects of the present invention are lessened. If the compound has less than 12 carbon atoms, the composition comes to have drawbacks such as reduced heat resistance. The low-molecular compound which is insoluble in water and soluble in an alkali should have at least two hydroxyl groups per molecule in order to produce the effects of the present invention. However, if the compound has more than 10 hydroxyl groups, the effects of the addition thereof are lost. If the ratio of phenolic hydroxyl groups to aromatic rings is below 0.5, the effects of the addition of the water-insoluble alkali-soluble low-molecular compound are not obtained. Ratios thereof exceeding 1.4 are undesirable in that the composition has poor stability, making it difficult to obtain the effects described above.

Examples of the low-molecular compound insoluble in water and soluble in an alkali include polyhydroxy compounds. Preferred examples thereof include phenols, resorcinol, phloroglucinol, phloroglucide, 2,4,2',4'-biphenyltetrol, 4,4'-thiobis(1,3-dihydroxy)benzene, 2,2', 4,4'-tetrahydroxydiphenyl ether, 2,2', 4,4'-tetrahydroxydiphenyl sulfoxide, 2,2', 4,4'-tetrahydroxydiphenyl sulfone, tris(4-hydroxyphenyl) methane, 1,1-bis(4-hydroxyphenyl)cyclohexane, 4,4'-($\alpha$-methylbenzylidene)bisphenol, $\alpha,\alpha',\alpha''$-tris(4-hydroxyphenyl)-1,3,5-triisopropylbenzene, $\alpha,\alpha',\alpha''$-tris(4-hydroxyphenyl)-1-ethyl-4-isopropylbenzene, 1,2,2-tris (hydroxyphenyl)propane, 1,1,2-tris(3,5-dimethyl-4- hydroxyphenyl)propane, 2,2,5,5-tetrakis(4-hydroxyphenyl) hexane, 1,2-tetrakis(4-hydroxyphenyl)ethane, 1,1,3-tris(hydroxyphenyl)butane, and α,α,α',α'-tetrakis(4-hydroxyphenyl)-p-xylene.

Such water-insoluble alkali-soluble low-molecular compounds having phenolic hydroxyl groups for use in the present invention can be easily synthesized by persons skilled in the art by reference to methods described, e.g., in JP-A-4-122938, JP-A-2-28531, JP-A-2-242973, JP-A-2-275995, JP-A-4-251849, JP-A-5-303199, JP-A-5-22440, JP-A-6-301204, U.S. Pat. Nos. 4,916,210, 5,210,657, and 5,318,875, and European Patent 219,294.

[8] Other Ingredients Usable in the Invention

The photosensitive composition of the present invention may optionally contain other ingredients such as dyes, pigments, plasticizers, surfactants, photosensitizers, and organic basic compounds.

Desirable organic basic compounds usable in the present invention are compounds which are more strongly basic than phenol, in particular, nitrogen-containing basic compounds. Preferred chemical environments include structures represented by the following formulae (A) to (E).

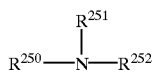 (A)

In formula (A), $R^{250}$, $R^{251}$, and $R^{252}$ may be the same or different and each represents a hydrogen atom, an alkyl group having 1 to 6 carbon atoms, an aminoalkyl group having 1 to 6 carbon atoms, a hydroxyalkyl group having 1 to 6 carbon atoms, or a substituted or unsubstituted aryl group having 6 to 20 carbon atoms, provided that $R^{254}$ and $R^{255}$ may be bonded to each other to form a ring.

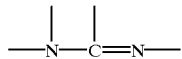 (B)

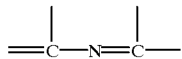 (C)

 (D)

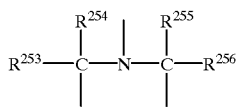 (E)

(In formula (E), $R^{253}$, $R^{254}$, $R^{255}$, and $R^{256}$ may be the same or different and each represents an alkyl group having 1 to 6 carbon atoms.)

Preferred organic basic compounds are nitrogen-containing basic compounds having, per molecule, two or more nitrogen atoms having different chemical environments. Especially preferred are compounds containing both at least one substituted or unsubstituted amino group and at least one nitrogen-containing ring structure and compounds having at least one alkylamino group. Examples of such preferred compounds include substituted or unsubstituted guanidine, substituted or unsubstituted aminopyridine, substituted or unsubstituted aminoalkylpyridines, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholines. Preferred substituents include amino, aminoalkyl groups, alkylamino groups, aminoaryl groups, arylamino groups, alkyl groups, alkoxy groups, acyl groups, acyloxy groups, aryl groups, aryloxy groups, nitro, hydroxy, and cyano. Specific examples of especially preferred organic basic compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine. However, the organic basic compounds usable in the present invention should not be construed as being limited to these examples.

Those nitrogen-containing basic compounds-may be used alone or in combination of two or more thereof. The added amount of the nitrogen-containing basic compounds is usually from 0.001 to 10 parts by weight, preferably from 0.01 to 5 parts by weight, per 100 parts by weight of the photosensitive resin composition (excluding the solvent). If the amount thereof is smaller than 0.001 part by weight, the effects of the present invention cannot be obtained. On the other hand, if it exceeds 10 parts by weight, reduced sensitivity and impaired developability at unexposed parts are liable to be caused.

Dyes suitable for use in the present invention are oil-soluble dyes and basic dyes. Examples thereof include Oil Yellow #101, Oil Yellow #103, Oil Pink #312, Oil Green BG, Oil Blue BOS, Oil Blue #603, Oil Black BY, Oil Black BS, Oil Black T-505 (all manufactured by Orient Chemical Industries Ltd., Japan), crystal violet (CI 42555), methyl violet (CI 42535), rhodamine B (CI 45170B), malachite green (CI 42000), and methylene blue (CI 52015).

Spectral sensitizers such as those given below may be further added to sensitize the photo-acid generator used so as to exhibit absorption in a region of longer wavelengths than far ultraviolet, whereby the photosensitive composition of the present invention can be rendered sensitive to an i- or g-line. Examples of spectral sensitizers suitable for use in the present invention include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzil, acridine orange, benzoflavin, cetoflavin T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonylbis(5,7-dimethoxycarbonylcoumarin), and coronene. However, the spectral sensitizers usable in the present invention should not be construed as being limited to these examples.

Those spectral sensitizers can be used also as light absorbers for absorbing the far ultraviolet emitted by a light source. In this case, the light absorber reduces light reflection from the substrate and lessens the influence of multiple reflection within the resist film, thereby producing the effect of diminishing standing wave.

For application to a substrate, the photosensitive composition of the present invention is used in the form of a solution in a solvent in which the ingredients described above dissolve. Preferred examples of the solvent include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran. These solvents may be used alone or as a mixture thereof. Preferred examples of the solvent include esters such as 2-methoxyethyl acetate, ethylene glycol monoethyl ether acetate, propylene glycol monomethyl ether acetate, methyl methoxypropionate, and ethyl ethoxypropionate. Use of such a solvent is advantageous in that the photo-acid generator represented by general formula (I) or (II) according to the present invention has good compatibility therewith and better solubility therein.

A surfactant can be added to the solvent. Examples of the surfactant include nonionic surfactants such as polyoxyethylene alkyl ethers, e.g., polyoxyethylene lauryl ether, polyoxyethylene stearyl ether, polyoxyethylene cetyl ether, and polyoxyethylene oleyl ether, polyoxyethylene alkylaryl ethers, e.g., polyoxyethylene octylphenol ether and polyoxyethylene nonylphenol ether, polyoxyethylene/polyoxypropylene block copolymers, sorbitan/fatty acid esters, e.g., sorbitan monolaurate, sorbitan monopalmitate, sorbitan monostearate, sorbitan monooleate, sorbitan trioleate, and sorbitan tristearate, and polyoxyethylene-sorbitan/fatty acid esters, e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as F-Top EF301, EF303, and EF352 (manufactured by New Akita Chemical Company, Japan), Megafac F171 and F173 (manufactured by Dainippon Ink & Chemicals, Inc., Japan), Fluorad FC430 and FC431 (manufactured by Sumitomo 3M Ltd., Japan), Asahi Guard AG710 and Surflon S-382, SC101, SC102, SC103, SC104, SC105, and SC106 (manufactured by Asahi Glass Co., Ltd., Japan); organosiloxane polymer KP341 (manufactured by Shin-Etsu Chemical Co., Ltd., Japan); and acrylic or methacrylic (co)polymers Polyflow No. 75 and No. 95 (manufactured by Kyoeisha Chemical Co., Ltd., Japan). The added amount of the surfactant is usually 2 parts by weight or smaller, desirably 1 part by weight or smaller, per 100 parts by weight of the solid components of the composition of the present invention.

The surfactant may be added alone or in combination of two or more thereof.

A satisfactory resist pattern can be obtained by applying the photosensitive composition described above on a substrate such as those for use in the production of precision integrated-circuit elements (e.g., silicon/silicon dioxide coating) by an appropriate coating means, e.g., a spinner or coater, exposing the coating to light through a mask, and then baking and developing the coating.

As a developing solution for the photosensitive composition of the present invention, use can be made of an alkaline aqueous solution of an inorganic alkali, e.g., sodium hydroxide, potassium hydroxide, sodium carbonate, sodium silicate, sodium metasilicate, or ammonia water, a primary amine, e.g., ethylamine or n-propylamine, a secondary amine, e.g., diethylamine or di-n-butylamine, a tertiary amine, e.g., triethylamine or methyldiethylamine, an alcoholamine, e.g., dimethylethanolamine or triethanolamine, a quaternary ammonium salt, e.g., tetramethylammonium hydroxide or tetraethylammonium hydroxide, a cyclic amine, e.g., pyrrole or piperidine, or the like.

The alkaline aqueous solution for use as a developing solution may contain an appropriate amount of an alcohol and a surfactant.

The present invention will be explained below in more detail by reference to Examples, but the invention should not be construed as being limited thereto.

EXAMPLES

Synthesis Example (1)

Synthesis of Compound (I-1)

With 300 mL of distilled water was diluted 33.2 g of a 45% aqueous solution of triphenylsulfonium chloride. Thereto was added dropwise over a period of 1 hour an aqueous solution prepared by dissolving 17.4 g of commercial sodium dodecylbenzenesulfonate (soft type) in 300 mL of distilled water. The resultant viscous white precipitate was washed with distilled water, subsequently dissolved in methanol, and then crystallized from distilled water. The solid obtained was vacuum-dried at 50° C. to obtain 30 g of Compound (I-1) as a white solid.

Synthesis Example (2)

Synthesis of Compound (I-9)

Into a reaction vessel equipped with a stirrer, condenser, thermometer, and dropping device were introduced 15.1 g of commercial triisopropylbenzenesulfonyl chloride and 250 mL of isopropyl alcohol. The contents were homogenized. To the resultant homogeneous solution was added dropwise over a period of 30 minutes an aqueous solution prepared by dissolving 4 g of sodium hydroxide in 250 mL of distilled water. This mixture was stirred with heating at 100° C. for 5 hours. The solvent was removed from the resultant solution by vacuum distillation, and 300 mL of distilled water was added to the residue.

An aqueous solution prepared by diluting 33.2 g of a 45% aqueous solution of triphenylsulfonium chloride with 300 mL of distilled water was added dropwise over a period of 30 minutes to the aqueous solution of a hydrolyzated triisopropylbenzenesulfonyl chloride. The resultant viscous white precipitate was washed with distilled water, subsequently dissolved in methanol, and then crystallized from distilled water. The solid obtained was vacuum-dried at 50° C. to obtain 32 g of Compound (I-9) as a white solid.

Synthesis Example (3)

Synthesis of Compound (I-26)

With 300 mL of distilled water was diluted 33.2 g of a 45% aqueous solution of triphenylsulfonium chloride.

Thereto was added dropwise over a period of 1 hour an aqueous solution prepared by dissolving 18.9 g of commercial sodium undecyl 4-carboxybenzenesulfonate in 300 mL of distilled water. The resultant viscous white precipitate was washed with distilled water, subsequently dissolved in methanol, and then crystallized from distilled water. The solid obtained was vacuum-dried at 50° C. to obtain 33 g of Compound (I-26) as a white solid.

Synthesis Example (4)
Synthesis of Compound (I'-5)

The same procedure as in Synthesis Example (1) was conducted, except that a diphenyliodonium salt was used in place of triphenylsulfonium chloride. Thus, compound (I'-5) was synthesized.

Synthesis Example (5)
Synthesis of Compound (II-1)

Into a four-necked flask equipped with a reflux condenser, thermometer, dropping device, and stirrer were introduced 5 g of N-hydroxyphthalimide, 5.8 g of p-toluenesulfonyl chloride, and 100 mL of acetone. Thereto was added dropwise, with stirring, 3.26 g of triethylamine over a period of 30 minutes. This mixture was continuously stirred at room temperature for 1 hour. The reaction mixture obtained was poured into distilled water to conduct crystallization, and the resultant particulate precipitate was taken out by filtration. Thus, 9.6 g of Compound (II-1) was obtained.

Synthesis Example (6)
Synthesis of Compound (II-15)

Into a four-necked flask equipped with a reflux condenser, thermometer, dropping device, and stirrer were introduced 28.4 g of N-hydroxylamine (hydrochloride) and 100 mL of distilled water. Thereto was added dropwise over a period of 20 minutes an aqueous solution prepared by dissolving 15.8 g of sodium hydroxide in 50 mL of distilled water. After completion of the addition, 50 g of methylmaleic anhydride was added. This mixture was stirred at room temperature for 3 hours and then further stirred with heating and refluxing for 3 hours. After completion of the reaction, an aqueous hydrochloric acid solution was added to the reaction mixture. The resultant mixture was saturated with sodium chloride and then extracted with ethyl acetate. The ethyl acetate solution obtained was concentrated to obtain crude crystals of an N-hydroxylated imide of methylmaleic anhydride. This reaction product was recrystallized from toluene to obtain 32 g of crystals of the N-hydroxylated imide of methylmaleic anhydride.

Into the same apparatus were introduced 5 g of the N-hydroxylated imide of methylmaleic anhydride obtained above, 7.3 g of p-methoxybenzenesulfonyl chloride, and 100 mL of acetone. Thereto was added dropwise, with stirring, 3.76 g of triethylamine over a period of 30 minutes. This mixture was continuously stirred at room temperature for 1 hour. The reaction mixture obtained was poured into distilled water to conduct crystallization, and the resultant particulate precipitate was taken out by filtration. Thus, 10.2 g of Compound (II-15) was obtained.

Synthesis Example (7)
Synthesis of Compound (II-16)

The same procedure as in Synthesis Example (6) was conducted, except that 2-mesitylenesulfonyl chloride was used in place of p-methoxybenzenesulfonyl chloride. Thus, Compound (II-16) was synthesized.

Synthesis Example (8)
Synthesis of Alkali-soluble Resin a

The following ingredients were dissolved in 120 ml of butyl acetate.
p-Acetoxystyrene 27.5 g (0.17 mol)
Styrene 3.15 g (0.030 mol)

To the solution was added 0.033 g of azobisisobutyronitrile (AIBN) three times at an interval of 2 hours with stirring at 80° C. in a nitrogen stream. After the final addition thereof, the mixture was continuously stirred for 2 hours to conduct a polymerization reaction. The resultant reaction mixture was poured into 600 ml of hexane to precipitate a white resin.

The resin obtained was dried and then dissolved in 150 ml of methanol. Thereto was added an aqueous solution consisting of 7.7 g (0.19 mol) of sodium hydroxide and 50 ml of water. This mixture was heated with refluxing for 3 hours to hydrolyze the resin, subsequently diluted with 200 ml of water, and then neutralized with hydrochloric acid to precipitate a white resin.

The resin precipitated was taken out by filtration, washed with water, and then dried to obtain 21 g of the resin. Through NMR spectrometry, this resin was found to be made up of p-hydroxystyrene units and styrene units in a ratio of about 85/15. Through GPC, the resin was found to have a weight-average molecular weight of 27,000. The molecular weight distribution thereof was 1.9.

Synthesis Example (9)
Synthesis of Resin A (resin having groups capable of decomposing by the action of acid to enhance solubility in alkaline developing solution)

In 250 ml of dehydrated tetrahydrofuran was dissolved 48.1 g of poly(p-hydroxystyrene)(weight-average molecular weight, 11,000; molecular weight distribution, 1.10; used after vacuum drying with heating). To this solution maintained at room temperature were added 17.5 g of t-butyl vinyl ether and 0.19 g of p-toluenesulfonic acid monohydrate. After the atmosphere in the vessel was replaced with nitrogen, the vessel was sealed and the contents were stirred at room temperature for 20 hours. Thereafter, the reaction mixture was neutralized with triethylamine and then poured with stirring into a solution consisting of 3 liters of ion-exchanged water and 3 g of triethylamine. The resin precipitated was taken out by filtration, washed with water, and then vacuum-dried at 70° C. Thus, 56 g of a white resin was obtained. It was ascertained through NMR spectrometry that 26% of the OH groups of the starting resin had been t-butoxy-1-ethylated (t-butylacetalized). GPC revealed that the resin had a weight-average molecular weight of 15,000, a molecular weight distribution of 1.25, and a degree of protection of 38%.

Synthesis Example (10)
Synthesis of Resin B

The following ingredients were dissolved in 250 ml of dehydrated tetrahydrofuran.
Poly(p-hydroxystyrene)(weight-average molecular weight; 11,000, molecular weight distribution, 1.10; used after vacuum drying with heating) 48.1 g
1,4-Dihydroxycyclohexane 0.47 g To this solution maintained at room temperature were added 14.0 g of t-butyl vinyl ether and 0.19 g of p-toluenesulfonic acid monohydrate. After the atmosphere in the vessel was replaced with nitrogen, the vessel was sealed and the contents were stirred at room temperature for 20 hours. Thereafter, the reaction mixture was neutralized with triethylamine and then poured with stirring into a solution consisting of 3 liters of ion-exchanged water and 3 g of triethylamine. The resin precipitated was taken out by filtration, washed with water, and then vacuum-dried at 70° C.

Thus, 56 g of a white resin was obtained. It was ascertained through NMR spectrometry that 27% of the OH groups of the starting resin had been t-butoxy-1-ethylated (t-butylacetalized). GPC revealed that the resin had a weight-average molecular weight of 33,000, a molecular weight distribution of 1.75, and a degree of protection of 32%.

Synthesis Example (11)
Synthesis of Resin C

The same procedure as in Synthesis Example (10) was conducted, except that VP-8000 (weight-average molecular weight, 8,500; degree of dispersion, 1.12), manufactured by Nippon Soda Co., Ltd., Japan through anionic polymerization, was used as an unprotected starting resin. Thus, resin C was synthesized, which had a weight-average molecular weight of 29,000, a molecular weight distribution of 1.75, and a degree of protection of 32%.

Synthesis Example (12)
Synthesis of Dissolution Inhibitive Compound (i)

In 300 ml of N,N-dimethylacetamide was dissolved 42.4 g (0.10 mol) of 1-[α-methyl-α-(4'-hydroxyphenyl)ethyl]-4-[α',α'-bis(4''-hydroxyphenyl)ethyl]benzene. Thereto were added 49.5 g (0.35 mol) of potassium carbonate and 84.8 g (0.33 mol) of cumyl bromoacetate. The resultant mixture was stirred at 120° C. for 7 hours, and then poured into 2 liters of ion-exchanged water. This mixture was neutralized with acetic acid and then extracted with ethyl acetate. The ethyl acetate solution resulting from the extraction was concentrated, and the residue was purified by column chromatography (column packing, silica gel; developing solvent, ethyl acetate/n-hexane=3/7 (by volume)). Thus, 70 g of dissolution inhibitive compound (18)(each R is —CH(CH$_3$)O—C$_2$H$_5$) was obtained.

Synthesis Example (13)

Synthesis of Dissolution Inhibitive Compound (ii)

In 400 ml of diethyl ether was dissolved 20 g of α,α',α''-tris(4-hydroxyphenyl)-1,3,5-triisopropylbenzene. To this solution were added 31.6 g of 3,4-dihydro-2H-pyran and a catalytic amount of hydrochloric acid in a nitrogen stream. This mixture was reacted with refluxing for 24 hours. After completion of the reaction, a small amount of sodium hydroxide was added, and the resultant mixture was filtered. The solvent was removed from the filtrate by distillation, and the residual reaction product was purified by column chromatography and dried to obtain dissolution inhibitive compound (31) (each R is a THP group).

Preparation and Evaluation of Photosensitive Compositions (Resists)

Photosensitive compositions were prepared using the compounds according to the present invention which were shown in the Synthesis Examples given above and further using the alkali-soluble low-molecular compound specified later and triphenylimidazole (TPI) as additives.

Each resist was prepared by dissolving the solid ingredients shown in Table 1 in 9.5 g of propylene glycol monomethyl ether acetate and filtering the solution through a 0.2-μm filter. This resist solution was applied to a silicon wafer with a spin coater, and the coating was dried at 110° C. for 90 seconds with a vacuum suction type hot plate to obtain a resist film having a thickness of 0.83 μm.

The obtained resist films were exposed to light using a 248 nm KrF excimer laser stepper (NA=0.42). Immediately after the exposure, the resist films each was heated with a 100° C. vacuum suction type hot plate for 60 seconds, subsequently immersed for 60 seconds in a 2.38% aqueous solution of tetramethylammonium hydroxide (TMAH), rinsed with water for 30 seconds, and then dried. The thus-obtained resist patterns on silicon wafers were evaluated for profile, sensitivity, and resolving power by the following methods and compared. The results obtained are shown in Table 2.

Profile

The thus-obtained resist patterns on silicon wafers were examined with a scanning electron microscope, and the SEM photographs were visually evaluated for profile, in particular, standing wave and collapse. With respect to standing wave, the patterns judged to be allowable are indicated by "A", and those judged to be unallowable are indicated by "B". With respect to collapse, the patterns in which collapse was observed are indicated by "C", while those in which collapse was not observed are indicated by "A". The patterns which had suffered marked undercut at the pattern interface and had the fear of collapse are indicated by "B".

Sensitivity

Sensitivity is expressed in terms of the exposure amount necessary for reproducing a 0.35-μm mark pattern.

Resolving Power

Resolving power is expressed in terms of threshold resolution at the exposure amount necessary for reproducing a 0.35-μm mask pattern.

Line Width Difference between Heating immediately after Exposure and Heating at 2 Hours after Exposure After exposure was conducted in the same manner as described above, the resist films were allowed to stand for 2 hours and then heated in the same manner. Immediately thereafter, the resist films were developed with the developing solution shown above. The line width of each of the 0.35-μm mask pattern obtained was measured, and the difference between this found value and that of the corresponding 0.35-μm mask pattern obtained through heating immediately after exposure was calculated. The resist patterns in which that difference was below 10% are indicated by "A", and those in which that difference was 10% or larger are indicated by "B".

TABLE 1

Formulations for Resists

| | Photo-acid Generator (I), (I') | | Photo-acid Generator (II) | | Resin | | Dissolution Inhibitive Compound | | Alkali-soluble Resin | Alkali-soluble Low-molecular Compound | TPI (mg) |
|---|---|---|---|---|---|---|---|---|---|---|---|
| | Kind | Amount (mg) | Kind | Amount (g) | Kind | Amount (g) | Kind | Amount (g) | | | |
| Ex. 1 | I-1 | 50 | 15 | 70 | B | 2.18 | | | | | 10 |
| Ex. 2 | I-9 | 50 | 15 | 70 | B | 2.18 | | | | | 10 |
| Ex. 3 | I-26 | 50 | 15 | 70 | B | 2.18 | | | | | 10 |
| Ex. 4 | I'-5 | 50 | 15 | 70 | B | 2.18 | | | | | 10 |
| Ex. 5 | I-1 | 50 | 1 | 70 | B | 2.18 | | | | | 10 |
| Ex. 6 | I-26 | 40 | 16 | 80 | B | 2.18 | | | | | 10 |
| Ex. 7 | I-1 | 40 | 1/15 | 40/40 | C | 2.18 | | | | | 10 |
| Ex. 8 | I-9 | 40 | 1/15 | 40/40 | C | 2.18 | | | | | 10 |
| Ex. 9 | I-26 | 50 | 1/15 | 35/35 | C | 2.18 | | | | | 10 |
| Ex. 10 | I-1 | 10 | 16 | 110 | C | 2.18 | | | | | 10 |
| Ex. 11 | I-1 | 110 | 15 | 10 | A | 2.18 | | | | | 10 |
| Ex. 12 | I-1 | 100 | 15 | 20 | A | 2.18 | | | | | 10 |
| Ex. 13 | I-1 | 60 | 15 | 60 | C | 1.9 | (i) | 0.2 | b 0.1 g | | 10 |
| Ex. 14 | I-1 | 60 | 15 | 60 | B | 1.9 | (i) | 0.2 | | 0.1 g | 10 |
| Ex. 15 | I-1 | 90 | 16 | 30 | | | (i) | 0.4 | a 2.0 g | | 10 |
| Ex. 16 | I-1 | 100 | 16 | 20 | | | (ii) | 0.4 | a 2.0 g | | 10 |
| Comp. Ex. 1 | III | 125 | IV | 125 | B | 2.5 | | | | | 10 |
| Comp. Ex. 2 | III | 12.5 | V | 280 | B | 2.5 | | | | | 10 |
| Comp. Ex. 3 | III | 120 | V | 120 | B | 2.5 | | | | | 10 |
| Comp. Ex. 4 | I-1 | 120 | | | B | 2.18 | | | | | 10 |
| Comp. Ex. 5 | | | II-1 | 120 | B | 2.18 | | | | | 10 |

Comparative photosensitive material (III):
  Triphenylsulfonium triflate
Comparative photosensitive material (IV):
  Tris-2,3-dibromopropyl isocyanurate
Comparative photosensitive material (V):
  5-Diazomerdorum acid Alkali-soluble resin b:
  VP-8000, manufactured by Nippon Soda Co., Ltd.
Alkali-soluble low-molecular compound:
  1-[α-Methyl-α-(4'-hydroxyphenyl)ethyl]-4-[α',α'-bis(4"-hydroxyphenyl)ethyl]benzene

TABLE 2

Results of Resist Evaluation

| | Sensitivity (mJ/cm$^2$) | Resolving Power (μm) | Line width difference between heating immediately after exposure and heating at 2 hr after exposure | Profile | Standing Wave | Collapse |
|---|---|---|---|---|---|---|
| Ex. 1 | 32 | 0.27 | A | rectangular | A | A |
| Ex. 2 | 33 | 0.27 | A | rectangular | A | A |
| Ex. 3 | 31 | 0.27 | A | rectangular | A | A |
| Ex. 4 | 30 | 0.27 | A | rectangular | A | A |
| Ex. 5 | 29 | 0.27 | A | rectangular | A | A |
| Ex. 6 | 34 | 0.26 | A | rectangular | A | A |
| Ex. 7 | 33 | 0.27 | A | rectangular | A | A |
| Ex. 8 | 34 | 0.27 | A | rectangular | A | A |
| Ex. 9 | 33 | 0.27 | A | rectangular | A | A |
| Ex. 10 | 34 | 0.28 | A | rectangular | A | A |
| Ex. 11 | 28 | 0.26 | A | rectangular | A | A |
| Ex. 12 | 29 | 0.26 | A | rectangular | A | A |
| Ex. 13 | 31 | 0.27 | A | rectangular | A | A |

TABLE 2-continued

Results of Resist Evaluation

|  | Sensitivity (mJ/cm$^2$) | Resolving Power (μm) | Line width difference between heating immediately after exposure and heating at 2 hr after exposure | Profile | Profile Standing Wave | Collapse |
|---|---|---|---|---|---|---|
| Ex. 14 | 32 | 0.27 | A | rectangular | A | A |
| Ex. 15 | 28 | 0.27 | A | rectangular | A | A |
| Ex. 16 | 27 | 0.27 | A | rectangular | A | A |
| Comp. Ex. 1 | 26 | 0.29 | B | rectangular | A | C |
| Comp. Ex. 2 | 40 | 0.32 | B | rectangular | A | C |
| Comp. Ex. 3 | 25 | 0.30 | B | trapezoidal | A | C |
| Comp. Ex. 4 | 26 | 0.26 | B | rectangular | B | C |
| Comp. Ex. 5 | 36 | 0.31 | A | rectangular | A | A |

The results given in Table 2 show that the resists of the present invention were photosensitive compositions which had high sensitivity and high resolving power, reduced line width decrease with the lapse of time from exposure to heat treatment, and gave a resist pattern having a satisfactory profile having residual standing wave in an allowable degree and suffering no collapse.

As demonstrated above, the chemically amplified positive photosensitive composition of the present invention is excellent in sensitivity and resolving power, undergoes neither a decrease in resist pattern line width nor the formation of a T-top resist pattern surface with the lapse of time from exposure to heat treatment, and is reduced in residual standing wave and collapse.

While the invention has been described in detail and with reference to specific embodiments thereof, it will be apparent to one skilled in the art that various changes and modifications can be made therein without departing from the spirit and scope thereof.

What is claimed is:

1. A positive photosensitive composition comprising:

a resin having groups capable of decomposing by the action of an acid to enhance solubility of the resin in an alkaline developing solution and a compound represented by formula (I) or (I') and a compound represented by formula (II) as compounds capable of generating a sulfonic acid upon irradiation with actinic rays or radiation:

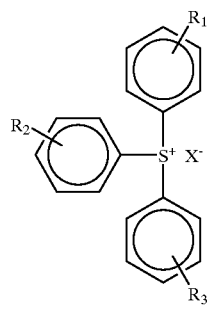

(I)

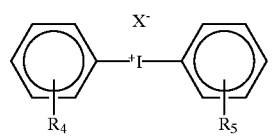

(I')

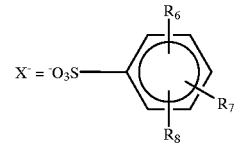

wherein $R_1$ to $R_5$, which may be the same or different, each represents a hydrogen atom, an alkyl group, a cycloalkyl group, an alkoxy group, a hydroxy group, a halogen atom, or a group represented by —S—$R_{12}$ where $R_{12}$ represents an alkyl group or an aryl group, and $R_6$ to $R_8$, which may be the same or different, each represents a hydrogen atom, an alkyl group, a cycloalkyl group, an alkenyl group, a group represented by —COOR$_{13}$ where R$_{13}$ represents an alkyl group or an alkenyl group, or a group represented by —OCOR$_{14}$ where $R_{14}$ represents an alkyl group or an alkenyl group, provided that at least one of $R_6$ to $R_8$ is an alkyl group, a cycloalkyl group, a group represented by —COOR$_{13}$, a group represented by —OCOR$_{14}$, or an alkenyl group, and that when two of $R_6$ to $R_8$ are a hydrogen atom, then the remaining one represents an alkyl group having 6 carbon atoms or more, a cycloalkyl group having 5 carbon atoms or more, an alkenyl group having 6 carbon atoms or more, a group represented by —COOR$_{13}$ where $R_{13}$ is an alkyl or alkenyl group having 5 carbon atoms or more, or a group represented by —OCOR$_{14}$ where $R_{14}$ is an alkyl or alkenyl group having 5 carbon atoms or more;

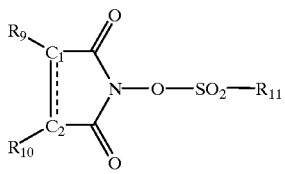

(II)

wherein $C_1$ and $C_2$ each is a carbon atom and are bonded to each other through a single bond or a double bond, $R_9$ and $R_{10}$, which may be the same or different, satisfy any of the following (1) to (4):

(1) $R_9$ and $R_{10}$ each independently represents a hydrogen atom, an alkyl group, a cycloalkyl group, or an aryl group, (2) $R_9$ and $R_{10}$, in combination with $C_1$ and $C_2$, form a mono- or polycyclic group which may contain one or more heteroatoms, (3) $R_9$ and $R_{10}$ form a fused aromatic ring containing $C_1$ and $C_2$, (4) at least one of $R_9$ and $R_{10}$ represents a residue containing an N-sulfonyloxyimido; and $R_{11}$ represents an alkyl group, a halogenated alkyl group, a cycloalkyl group, an alkenyl group, an aryl group which may have substituent(s), an aralkyl group which may have substituent(s), or a camphor group.

2. The positive photosensitive composition of claim 1, which contains a low-molecular acid-decomposable dissolution inhibitive compound having a molecular weight of 3,000 or lower which has groups decomposable by an acid and shows enhanced solubility in an alkaline developing solution by the action of an acid.

3. The positive photosensitive composition of claim 1, which contains a resin insoluble in water and soluble in an aqueous alkali solution.

4. The positive photosensitive composition of claim 1, wherein the resin having groups which decompose by the action of an acid to enhance solubility in an alkaline developing solution has acetal groups as the acid-decomposable groups.

5. The positive photosensitive composition of claim 1, which further contains a low-molecular compound having a molecular weight of 1,000 or lower which is insoluble in water and soluble in an aqueous alkali solution.

6. A positive photosensitive composition comprising:

a compound represented by formula (I) or (I') and a compound represented by formula (II) as compounds which generate a sulfonic acid upon irradiation with actinic rays or radiation:

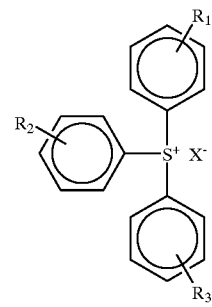

(I)

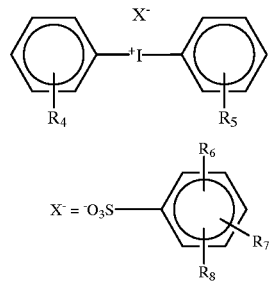

(I')

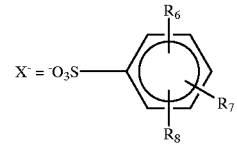

wherein $R_1$ to $R_5$, which may be the same or different, each represents a hydrogen atom, an alkyl group, a cycloalkyl group, an alkoxy group, a hydroxy group, a halogen atom, or a group represented by —S—R$_{12}$ where $R_{12}$ represents an alkyl group or an aryl group, and $R_6$ to $R_8$, which may be the same or different, each represents a hydrogen atom, an alkyl group, a cycloalkyl group, an alkenyl group, a group represented by —COOR$_{13}$ where R$_{13}$ represents an alkyl group or an alkenyl group, or a group represented by —OCOR$_{14}$ where $R_{14}$ represents an alkyl group or an alkenyl group, provided that at least one of $R_6$ to $R_8$ is an alkyl group, a cycloalkyl group, a group represented by —COOR$_{13}$, a group represented by —OCOR$_{14}$, or an alkenyl group, and that when two of $R_6$ to $R_8$ are a hydrogen atom, then the remaining one represents an alkyl group having 6 carbon atoms or more, a cycloalkyl group having 5 carbon atoms or more, an alkenyl group having 6 carbon atoms or more, a group represented by —COOR$_{13}$ where $R_{13}$ is an alkyl or alkenyl group having 5 carbon atoms or more, or a group represented by —OCOR$_{14}$ where $R_{14}$ is an alkyl or alkenyl group having 5 carbon atoms or more;

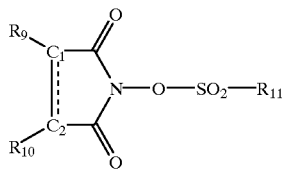

(II)

wherein $C_1$ and $C_2$ each is a carbon atom and are bonded to each other through a single bond or a double bond, $R_9$ and $R_{10}$, which may be the same or different, satisfy any of the following (1) to (4):

(1) $R_9$ and $R_{10}$ each independently represents a hydrogen atom, an alkyl group, a cycloalkyl group, or an aryl group, (2) $R_9$ and $R_{10}$, in combination with $C_1$ and $C_2$, form a mono- or polycyclic group which may contain one or more heteroatoms, (3) $R_9$ and $R_{10}$ form a fused aromatic ring containing $C_1$ and $C_2$, (4) at least one of $R_9$ and $R_{10}$ represents a residue containing an N-sulfonyloxyimido; and $R_{11}$ represents an alkyl group, a halogenated alkyl group, a cycloalkyl group, an alkenyl group, an aryl group which may have substituent(s), an aralkyl group which may have substituent(s), or a camphor group, a low-molecular acid-decomposable dissolution inhibitive compound having a molecular weight of 3,000 or lower which has groups decomposable by an acid and shows enhanced solubility in an alkaline developing solution by the action of an acid, and a resin insoluble in water and soluble in an aqueous alkali solution.

7. The positive photosensitive composition of claim 6, which further contains a low-molecular compound having a molecular weight of 1,000 or lower which is insoluble in water and soluble in an aqueous alkali solution.

* * * * *